(12) United States Patent
Taniguchi

(10) Patent No.: US 10,109,982 B2
(45) Date of Patent: Oct. 23, 2018

(54) SEMICONDUCTOR DEVICE

(71) Applicant: FURUKAWA ELECTRIC CO., LTD., Tokyo (JP)

(72) Inventor: Hidehiro Taniguchi, Tokyo (JP)

(73) Assignee: FURUKAWA ELECTRIC CO., LTD., Tokyo (JP)

(*) Notice: Subject to any disclaimer, the term of this patent is extended or adjusted under 35 U.S.C. 154(b) by 0 days.

(21) Appl. No.: 15/426,256

(22) Filed: Feb. 7, 2017

(65) Prior Publication Data
US 2017/0149214 A1   May 25, 2017

Related U.S. Application Data

(63) Continuation of application No. PCT/JP2015/072833, filed on Aug. 12, 2015.

(30) Foreign Application Priority Data

Aug. 12, 2014  (JP) ................................. 2014-164584

(51) Int. Cl.
*H01S 5/00*   (2006.01)
*H01S 5/16*   (2006.01)
(Continued)

(52) U.S. Cl.
CPC ............ *H01S 5/162* (2013.01); *H01S 5/0425* (2013.01); *H01S 5/22* (2013.01); *H01S 5/305* (2013.01);
(Continued)

(58) Field of Classification Search
CPC . H01S 5/162; H01S 5/22; H01S 5/305; H01S 5/4031; H01S 5/3086; H01S 5/3209; H01S 5/0425
See application file for complete search history.

(56) References Cited

U.S. PATENT DOCUMENTS 4,875,216 A * 10/1989 Thornton ............... B82Y 20/00
                                                 372/45.01
5,764,669 A   6/1998 Nagai
(Continued)

FOREIGN PATENT DOCUMENTS

JP    63-307791    12/1988
JP    6-77596      3/1994
(Continued)

OTHER PUBLICATIONS

International Search Report dated Nov. 2, 2015 in PCT/JP2015/072833 filed on Aug. 12, 2015 (with English translation).
(Continued)

*Primary Examiner* — Yuanda Zhang
(74) *Attorney, Agent, or Firm* — Oblon, McClelland, Maier & Neustadt, L.L.P.

(57) ABSTRACT

A semiconductor device includes: a semiconductor layered structure including an active layer, a first region including a part of the active layer and extending in a layered direction, a second region including at least a part of an end portion of the active layer and extending in the layered direction, disordering of the second region being higher than the first region, and a third region including a portion of the active layer between the first region and the second region and extending in the layered direction, disordering of the third region being higher than the first region and lower than the second region; and an electrode configured to inject an electric current to the active layer.

18 Claims, 15 Drawing Sheets

(51) Int. Cl.
*H01S 5/042* (2006.01)
*H01S 5/32* (2006.01)
*H01S 5/30* (2006.01)
*H01S 5/40* (2006.01)
*H01S 5/22* (2006.01)

(52) U.S. Cl.
CPC .......... *H01S 5/3086* (2013.01); *H01S 5/3209* (2013.01); *H01S 5/4031* (2013.01)

(56) References Cited

U.S. PATENT DOCUMENTS

| | | | |
|---|---|---|---|
| 6,005,881 A | 12/1999 | Ikoma | |
| 2005/0041709 A1* | 2/2005 | Anikitchev | B82Y 20/00 372/46.016 |
| 2005/0069004 A1 | 3/2005 | Watanabe et al. | |
| 2006/0007976 A1* | 1/2006 | Watanabe | B82Y 20/00 372/46.01 |
| 2006/0215723 A1* | 9/2006 | Watanabe | B82Y 20/00 372/103 |
| 2007/0026620 A1 | 2/2007 | Yamada | |
| 2007/0069221 A1* | 3/2007 | Hiroyama | B82Y 20/00 257/85 |
| 2007/0153857 A1 | 7/2007 | Chua et al. | |
| 2009/0028203 A1 | 1/2009 | Sakashita et al. | |
| 2010/0105158 A1 | 4/2010 | Yamada | |
| 2014/0027809 A1 | 1/2014 | Taniguchi et al. | |
| 2016/0181761 A1 | 6/2016 | Taniguchi et al. | |

FOREIGN PATENT DOCUMENTS

| | | |
|---|---|---|
| JP | 9-23037 | 1/1997 |
| JP | 10-200190 | 7/1998 |
| JP | 2001-15859 | 1/2001 |
| JP | 2005-101440 | 4/2005 |
| JP | 2006-294879 | 10/2006 |
| JP | 2007-242718 | 9/2007 |
| JP | 2009-55002 | 3/2009 |
| JP | 2010-245242 | 10/2010 |
| JP | 2011-103494 | 5/2011 |
| JP | 2012-222045 | 11/2012 |
| WO | WO 2005/057744 A1 | 6/2005 |

OTHER PUBLICATIONS

Written Opinion dated Nov. 2, 2015 in PCT/JP2015/072833, filed on Aug. 12, 2015.

* cited by examiner

SEMICONDUCTOR DEVICE

CROSS-REFERENCE TO RELATED APPLICATION(S)

This application is a continuation of International Application No. PCT/JP2015/072833, filed on Aug. 12, 2015, which claims the benefit of priority from Japanese Patent Application No. 2014-164584, filed on Aug. 12, 2014, the entire contents of which are incorporated herein by reference.

BACKGROUND

The present disclosure relates to a semiconductor device.

A semiconductor device having a function corresponding to a desired usage is manufactured by using semiconductors having different physical properties for respective regions of the semiconductor device. Physical properties such as band gap, refractive index, etc. are important for designing a device. Such physical properties of semiconductors may be adjusted to desirable values by changing materials, a type and concentration of doped impurities, combinations thereof and the like of layered semiconductors.

One way of altering the physical properties is disordering a semiconductor. As a method of the disordering, there is known an impurity free vacancy disordering (IFVD) method that disorders a semiconductor by diffusing an atomic vacancy by a rapid thermal anneal (RTA) method. For example, this method is used for manufacturing a semiconductor laser device. In a semiconductor laser device, heat may be generated by absorption of laser light at a facet when an optical output increases. In this case, a phenomenon called catastrophic optical damage (COD) may possibly occur, in which the laser device would not function because the facet is melted by the generated heat, and thus it will be a problem of reliability. To solve the problem, a facet transparentization technology by disordering is disclosed, and it is possible to raise the optical output limit, beyond which the COD occurs, by employing this technology.

The facet transparentization technology by disordering is a technology in which, by enlarging band gap energy of a semiconductor region in the vicinity of a facet of a semiconductor device by disordering the semiconductor region, the vicinity of the facet is transparentized for a light emission wavelength to suppress absorption of a laser light (see, for example, Japanese Laid-open Patent Publication No. 2007-242718, Japanese Laid-open Patent Publication No. 9-23037, Japanese Laid-open Patent Publication No. 10-200190, Japanese Laid-open Patent Publication No. 2001-15859, and Japanese Laid-open Patent Publication No. 2011-103494). The transparentized region is called a window region. A region not transparentized is called a non-window region.

In addition, a technology is proposed, which realizes a semiconductor optical device having various functions by varying disordering of regions extending in a layered direction of a semiconductor (see, for example, Japanese Laid-open Patent Publication No. 6-77596).

An example of the disordering by the atomic vacancy diffusion will be explained. FIG. 26 illustrates a vicinity of a facet of a semiconductor device under manufacturing process for explaining the example of the disordering by the atomic vacancy diffusion. As illustrated in FIG. 26, a semiconductor layer to be disordered includes: a substrate (not illustrated in the drawing); an active layer formed thereon; a p-type cladding layer 1012 containing a p-type impurity and formed on the active layer to sandwich a p-type cladding layer; a first impurity layer 1013 doped with a first impurity having a function of accelerating diffusion of an atomic vacancy, the first impurity layer 1013 having high conductivity and functioning as a contact layer; and a second impurity layer 1020 formed in a region (right side of a dashed line in FIG. 26) to be a non-window region on the first impurity layer 1013 and doped with a second impurity having a function of suppressing diffusion of the atomic vacancy. When disordering, a dielectric film 1021 functioning as a suppression film suppressing the disordering is formed on the second impurity layer 1020. Moreover, on an entire surface of the dielectric film 1021, a dielectric film 1022 functioning as an acceleration film accelerating the disordering is formed. By performing the RTA in this state, the atomic vacancy in the region to be the window region is diffused to disorder the semiconductor layer, and thus, the window region and the non-window region are formed.

In this state, a gap is formed at a border portion between each dielectric film and each semiconductor layer, for example, at a border i100 between the dielectric film 1021 and the dielectric film 1022 in FIG. 26, and a region where a semiconductor layer surface is not covered with the dielectric film 1022 may be formed. When performing the RTA with such region, a surface roughness may be formed in the region.

Moreover, a case is considered in which a laser device is manufactured with a semiconductor layer having surface roughness. FIG. 27 is a view for explaining an example of a semiconductor laser device having surface roughness and illustrating a vicinity of a facet of the semiconductor laser device. The semiconductor laser device illustrated in FIG. 27 is manufactured by removing an upper portion of the semiconductor laser device under the manufacturing process illustrated in FIG. 26 by etching, and forming thereon an insulation film 1016 and an upper electrode 1017. Moreover, this semiconductor laser device emits laser by an optical cavity formed by a low reflectivity film 1002 formed on a light-emitting facet side and a high reflectivity film (not illustrated in the drawings) formed on a rear facet side opposing to the light-emitting facet side. It is supposed that a surface roughness r100 is formed in this state of the first impurity layer 1013.

In order to drive this semiconductor laser device, an electric current is injected from the upper electrode 1017. Then, the injected electric current flows downward via the first impurity layer 1013 and flows in the highly conductive first impurity layer 1013 in a horizontal direction. Then, the electric current flowing in the first impurity layer 1013 reaches the surface roughness r100. When energy of the electric current is applied to the surface roughness r100, a dislocation is generated at the surface roughness r100 as an origination, and progresses to an active layer on an electric-current-injection side, that is, a region of the active layer below the upper electrode 1017. There is a problem that, when the dislocation reaches the active layer on the electric-current-injection side, the dislocation grows rapidly by the energy applied to the active layer by the electric current injection, and a dislocation loop is formed, thus the semiconductor laser device is deteriorated. In this case, the surface roughness r100 existing in the vicinity of the border between the window region and the non-window region is an origination of a failure mode.

SUMMARY OF THE INVENTION

It is an object of the present invention to at least partially solve the problems in the conventional technology.

A semiconductor device according to one aspect of the present disclosure includes: a semiconductor layered structure including an active layer, a first region including a part of the active layer and extending in a layered direction, a second region including at least a part of an end portion of the active layer and extending in the layered direction, disordering of the second region being higher than the first region, and a third region including a portion of the active layer between the first region and the second region and extending in the layered direction, disordering of the third region being higher than the first region and lower than the second region; and an electrode configured to inject an electric current to the active layer.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
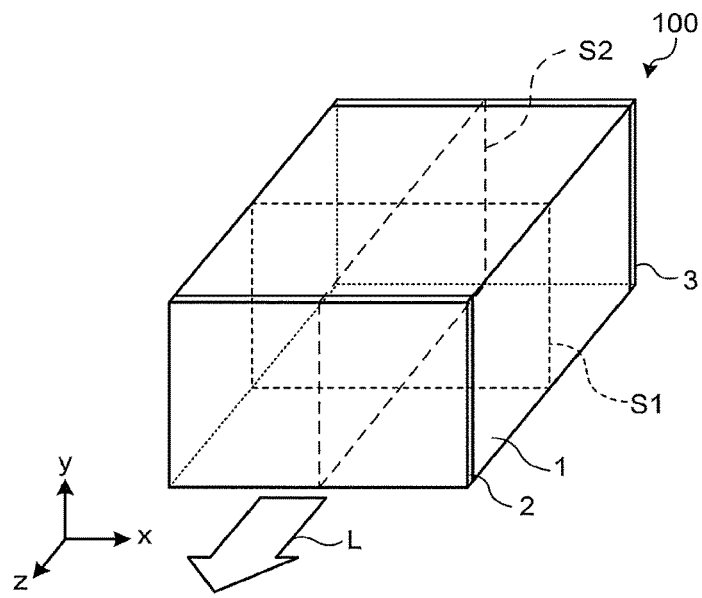
FIG. 1 is a schematic perspective view of a semiconductor device according to a first embodiment.

Next, embodiments of semiconductor devices according to the present disclosure will be explained with reference to the drawings. The present disclosure is not limited to these embodiments. In each drawing, identical or corresponding elements are given same reference numerals appropriately. Moreover, it should be noted that the drawings illustrate schematic examples. Accordingly, a relationship between respective elements may be different from real values. Among the drawings, there may be parts where the relationships and ratios of the illustrated sizes are different from one another.

First Embodiment

To start with, a semiconductor device according to the first embodiment of the present disclosure will be explained. A semiconductor device according to the first embodiment is an edge-emission-type semiconductor laser device having a ridge structure and hereby achieving confinement of light in a width direction and an electric current constriction structure.

FIG. 1 is a schematic perspective view of the semiconductor device according to the first embodiment. Next, as illustrated in FIG. 1, a y-axis indicates a layered direction of the semiconductor, a z-axis indicates a light-emitting direction of laser light among surface directions orthogonal to the y-axis, and an x-axis indicates a direction orthogonal to the y-axis and the z-axis. As illustrated in FIG. 1, this semiconductor laser device 100 includes: a low reflectivity film 2 formed at on light-emitting facet side of a device main body 1 and having, for example, 10% or less of reflectivity; and a high reflectivity film 3 formed on a rear facet side opposing to the light-emitting facet side and having, for example, 90% or more of reflectivity. Then, the semiconductor laser device 100 emits laser light L via the low reflectivity film 2.

Figure 2:
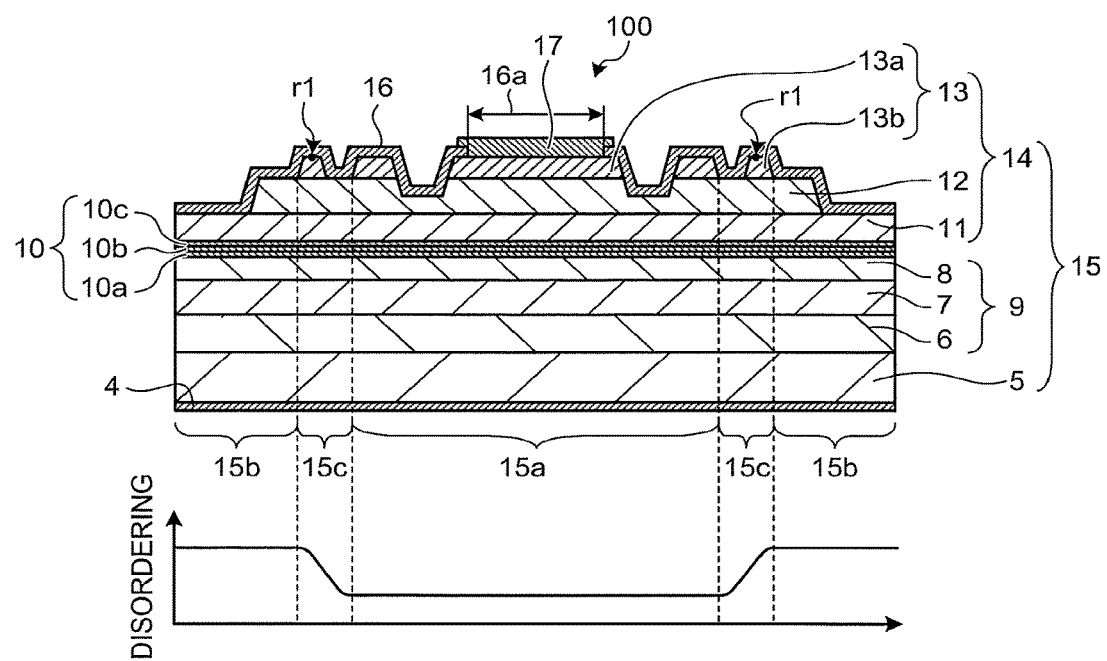
FIG. 2 illustrates a cross section in an x-y plane and disordering of the semiconductor device illustrated in FIG. 1.
Figure 3:
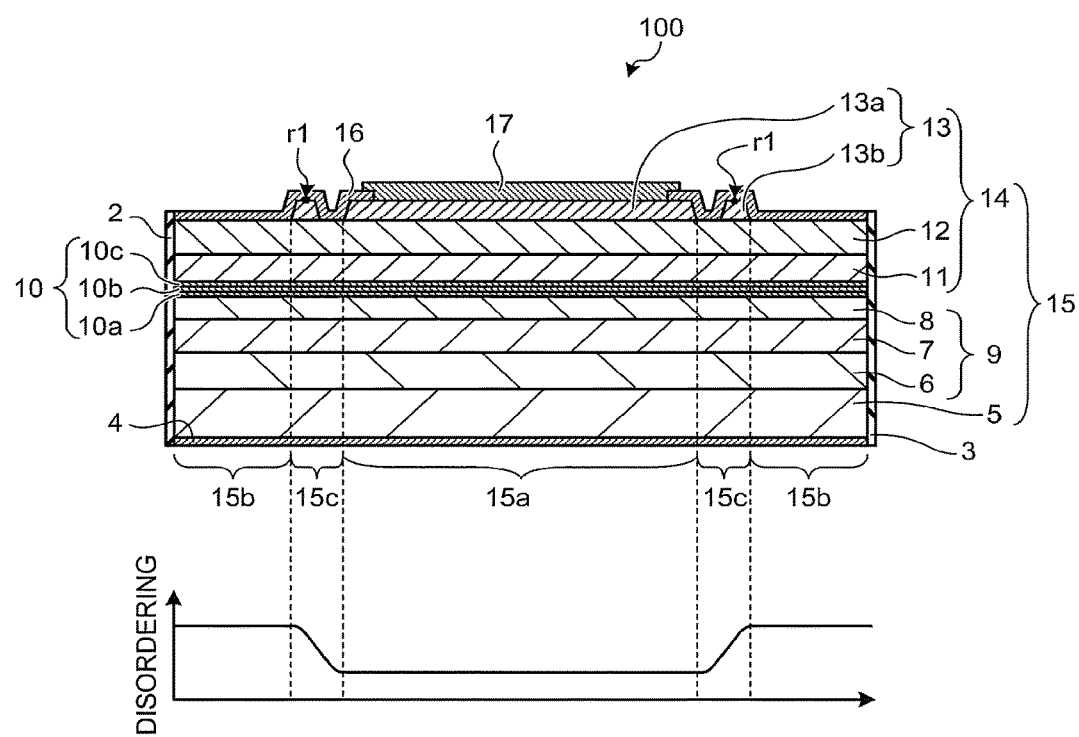
FIG. 3 illustrates a cross section in a y-z plane and the disordering of the semiconductor device illustrated in FIG. 1.

FIGS. 2 and 3 illustrate cross sections in an x-y plane and a y-z plane and disordering of the semiconductor laser device illustrated in FIG. 1. That is, FIGS. 2 and 3 illustrate cross sections at a cross section S1 and a cross section S2 of FIG. 1. The disordering will be explained in detail later.

As illustrated in FIG. 2, the semiconductor laser device 100 includes a semiconductor layered structure 15 including: a substrate 5 made of an n-type GaAs including a lower electrode 4 which is an n-side electrode and formed on a bottom surface of the substrate 5; an n-type semiconductor region 9 including an n-type buffer layer 6, an n-type cladding layer 7, and an n-type guide layer 8; an active layer 10; and a p-type semiconductor region 14 including a p-type guide layer 11, a p-type cladding layer 12 as a lower first impurity layer and an upper first impurity layer 13. The n-type semiconductor region 9, the active layer 10 and the p-type semiconductor region 14 are formed on the substrate 5 in that order. Herein, in a center portion in an x-axis direction, an upper portion of the p-type cladding layer 12 and the upper first impurity layer 13 (13a) are trapezoids in their cross sections and have striped shapes extending in a z-axis direction. Hereby the semiconductor laser device 100 is of a ridge structure. Moreover, formed on both sides of the ridge structure are support mesa structures by the p-type cladding layer 12 and the upper first impurity layer 13 (13b). In addition, the semiconductor laser device 100 includes an insulation film 16 formed on the p-type semiconductor region 14 and an upper electrode 17 which is a p-side electrode contacting the upper first impurity layer 13 via an upper base, on which the insulation film 16 is not formed, of the trapezoid of the ridge structure.

The n-type buffer layer 6 is made of GaAs and is a buffer layer for depositing a layered structure of high quality epitaxial layers on the substrate 5. The n-type cladding layer 7 and the n-type guide layer 8 are made of AlGaAs of which refractive indices and thicknesses are set so that a desirable optical confinement state is achieved relative to a layered direction. An Al composition of the n-type guide layer 8 may be 20% or more and less than 40%. A refractive index of the n-type cladding layer 7 is lower than that of the n-type guide layer 8. The thickness of the n-type guide layer 8 may be 50 nm or more, for example, approximately 1000 nm. The thickness of the n-type cladding layer 7 may be approximately 1 μm to 3 μm. These n-type semiconductor regions 9 contain, for example, silicon (Si) as an n-type dopant.

The active layer 10 includes a lower barrier layer 10a, a quantum well layer 10b, and an upper barrier layer 10c, and has a single quantum well (SQW) structure. The lower barrier layer 10a and the upper barrier layer 10c have functions of barriers confining a carrier in the quantum well layer 10b and made of highly pure AlGaAs not intentionally doped with impurities. The quantum well layer 10b is made of highly pure InGaAs not intentionally doped with impurities. An In composition and a thickness of the quantum well layer 10b, and compositions of the lower barrier layer 10a and the upper barrier layer 10c are adjusted in accordance with a desirable light emission center wavelength (for example, 0.98 μm). A structure of the active layer 10 may be a multiple quantum well (MQW) structure in which a layered structure of the quantum well layer 10b and barrier layers formed on and below thereof is repeated by a desirable times, or may be a bulk structure in which the lower barrier layer 10a and the upper barrier layer 10c do not exist. Although the configuration by the highly pure layers not intentionally doped with impurities has been explained above, the quantum well layer 10b, the lower barrier layer 10a, and the upper barrier layer 10c may be doped with a donor and an acceptor intentionally.

The p-type guide layer 11 and the p-type cladding layer 12 are made of AlGaAs of which refractive indices and thicknesses are set so as to achieve a desirable optical confinement state relative to the layered direction in combination of the above-described n-type cladding layer 7 and the n-type guide layer 8, respectively. The Al composition of the p-type guide layer 11 may be 20% or more and less than 40%. The refractive index of the p-type cladding layer 12 is lower than that of the p-type guide layer 11. In order to offset an optical field in the layers in a direction of the n-type cladding layer 7 to reduce a waveguide loss, the Al composition of the p-type cladding layer 12 is set to be slightly greater than that of the n-type cladding layer 7. The Al composition of the p-type guide layer 11 is set to be less than the Al composition of the p-type cladding layer 12. The thickness of the p-type guide layer 11 may be 50 nm or more, for example, approximately 1000 nm. The thickness of the p-type cladding layer 12 may be approximately 1 μm to 3 μm. These p-type semiconductor regions 14 contain carbon (C) as a p-type dopant. A C-concentration of the p-type guide layer 11 is set at, for example, 0.1 to $1.0 \times 10^{17}$ cm$^{-3}$, and may be at approximately 0.5 to $1.0 \times 10^{17}$ cm$^{-3}$. A concentration of the p-type cladding layer 12 is set at, for example, $1.0 \times 10^{17}$ cm$^{-3}$ or more.

The upper first impurity layer 13 is made of GaAs doped with, for example, approximately $1.0 \times 10^{17}$ to $5.0 \times 10^{19}$ to $5.0 \times 10^{20}$ cm$^{-3}$ of C as a first impurity which is the p-type impurity.

Although C in the p-type semiconductor region 14 may be diffused in the p-type semiconductor region 14 by the later-described RTA, such diffusion by the RTA hardly occurs because a diffusion coefficient of C is small. Therefore, because of sufficiently high concentration of C and high conductivity, the upper first impurity layer 13 is preferable as a contact layer whose contact resistance to the upper electrode 17 is low.

Similarly, zinc (Zn) as a second impurity that is the p-type impurity is diffused in the p-type semiconductor region 14 by the RTA. This is caused by forming a layer is doped with Zn and diffusing the Zn from this layer by the RTA in the later-described manufacturing process. Because of a large diffusion coefficient, the Zn is diffused in the p-type semiconductor region 14 by the RTA. Since a concentration of the Zn in the Zn-doped layer is reduced by the diffusion, the conductivity may be reduced. Therefore, in the later-described manufacturing process, the Zn-doped layer is removed by etching.

Herein, C and Zn have functions of accelerating or suppressing the diffusion of an atomic vacancy by the RTA in the manufacturing process. Although C and Zn themselves may be diffused by the RTA, conditions of the RTA such as a temperature, time and the like may be adjusted so that C and Zn are not diffused to the active layer 10 by the RTA in the first embodiment. Moreover, the insulation film 16 is made of, for example, SiN$_x$.

The upper electrode 17 is made of a metal material that provides an Ohmic contact with a semiconductor material of the upper first impurity layer 13.

Moreover, this semiconductor laser device 100 realizes the electric current constriction by limiting a contact area of the upper electrode 17 and the p-type semiconductor region 14 to an aperture portion 16a of the insulation film 16.

The upper electrode 17 is isolated from an outermost surface of the semiconductor layered structure 15 by the insulation film 16 in a second region 15b and a third region 15c. Hereby, in the semiconductor laser device 100, an electric-current-injecting region is selectively formed on a first region 15a. The injection of electric current into the second region 15b and the third region 15c may be suppressed by selectively forming the upper electrode 17 directly on the first region 15a without the insulation film.

Herein, as illustrated in FIGS. 2 and 3, the semiconductor layered structure 15 includes the first region 15a, the second region 15b, and the third region 15c.

Figure 4:
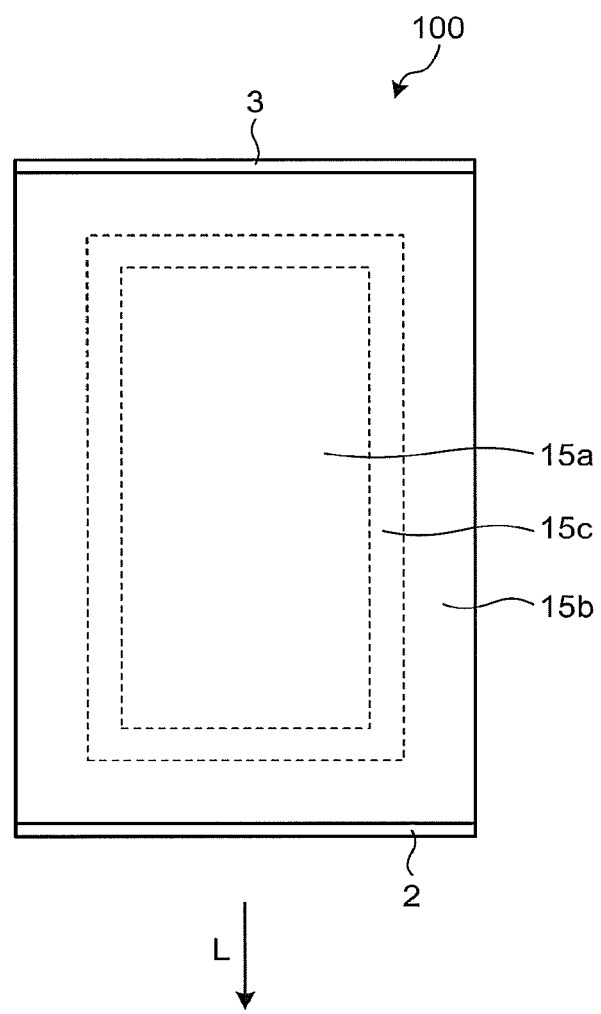
FIG. 4 is a top plan view in an x-z plane of the semiconductor device illustrated in FIG. 1.

The first region 15a, the second region 15b, and the third region 15c are three regions including a part of the active layer 10 and extending in the layered direction. FIG. 4 is a top plan view in an x-z plane of the semiconductor device illustrated in FIG. 1. As illustrated in FIG. 4, the second region 15b is formed in a region adjacent to four side surfaces of the semiconductor laser device 100 and surrounds the first region 15a, and the third region 15c is formed between the first region 15a and the second region 15b.

Next, disordering of the semiconductor laser device 100 will be explained. The disordering by the atomic vacancy diffusion at respective regions is illustrated below the semiconductor laser device 100 in FIGS. 2 and 3. As illustrated in the drawings, the disordering of the second region 15b is higher than that of the first region 15a, and the disordering of the third region 15c is higher than that of the first region 15a and lower than that of the second region 15b. Since band gap energy increases when the semiconductor is disordered, the disordering of the semiconductor may be indicated as an amount which is proportional to a difference between band gap energies of the non-disordered semiconductor and the disordered semiconductor.

The second region 15b is sufficiently disordered by the diffusion of the atomic vacancy by the RTA, and the disordering of the second region 15b is higher than the first region 15a. That is, the second region 15b corresponds to a window region formed by the IFVD method, and the first region 15a corresponds to a non-window region formed by the IFVD method. Hereby a difference between the band gap energy of the active layer 10 of the second region 15b and the band gap energy of the active layer 10 of the first region 15a is, for example, 10 meV or more. Herein 1 eV is approximately $1.60 \times 10^{-19}$ joule.

The window region is a sufficiently disordered region in the vicinity of a center of the active layer, and band gap energy of the window region is higher than band gap energy of a region to emit light when an electric current is injected. The non-window region is a region which is not the window region, and the disordering of which is suppressed.

Figure 28:
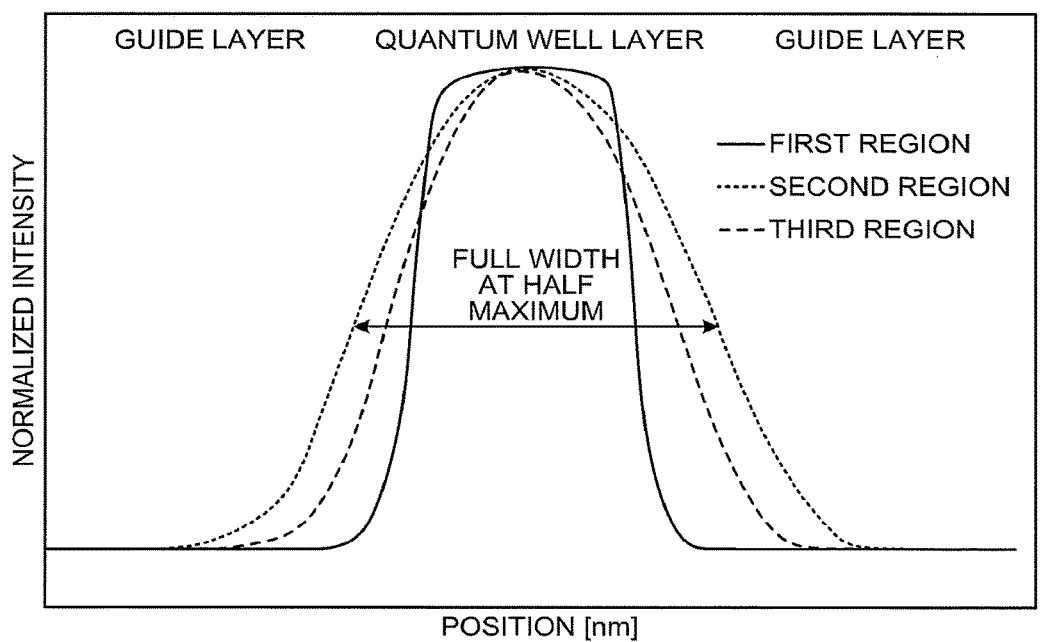
FIG. 28 is a view for explaining a definition of disordering using an example of a profile of a contrast of a transmission-type electron microscope image in the vicinity of an active layer.

Herein, an example of an index for the disordering will be explained. FIG. 28 is a view for explaining a definition of the disordering using an example of a profile of a contrast of a transmission-type electron microscope (TEM) image in the vicinity of the active layer. A solid line indicates the profile of the first region, a dotted line indicates the profile of the second region, and a dashed line indicates the profile of the third region. A horizontal axis indicates positions, in the layered direction, of the quantum well layer and a guide layer (in an order of nano meter), and a vertical axis indicates normalized intensities of the profiles. That is, for better understanding, the intensity of each profile is normalized so that an average value of the guide layer is minimum and a peak value of the quantum well layer is maximum. The profiles of the first region and the second region are average profiles, and a mere example is illustrated for the third region since the profile varies based on positions. As illustrated in FIG. 28, in comparison to the hardly disordered first region, a boundary between the quantum well layer and the guide layer becomes unclear and the profile becomes wider in the well-disordered second region. Herein, as an index of the disordering, a full width at half maximum relative to the maximum intensity of the profile may be used. In FIG. 28, the full width at half maximum of the second region is indicated by a double-arrowed line. When the full width at half maximum is wider, it indicates a high disordering, and conversely, when the full width at half maximum is narrower, it indicates lower disordering. Since the full width at half maximum of the profile of the third region is of a value between an average value of the full width at half maximum of the profile of the first region and an average value of the full width at half maximum of the profile of the second region, the disordering is of a value between both of them as well.

Next, an operation of the semiconductor laser device 100 will be explained. To start with, a voltage is applied between the lower electrode 4 and the upper electrode 17, and then a carrier is injected to the active layer 10 from the n-type semiconductor region 9 and the p-type semiconductor region 14. An electric current path of a hole carrier injected in this state from the upper electrode 17 via the p-type semiconductor region 14 is constricted by the insulation film 16 at the aperture portion 16a, and then injected to the active layer 10 efficiently with increased electric current density. A width of the aperture portion 16a with which the electric current is injected is an electric-current-injection width. The active layer 10 to which the electric current is injected emits light having a predetermined light emission center wavelength. The emitted light is confined in the vicinity of the active layer 10 in the x-axis direction by the ridge structure and in the y-axis direction by a refractive index difference between the guide layer and a cladding layer, and while being guided in the z-axis direction, the emitted light is subjected to laser emission by an optical amplification effect of the active layer 10 and an optical cavity formed by the low reflectivity film 2 and the high reflectivity film 3. Hereby, as illustrated in FIG. 1, the semiconductor laser device 100 emits the laser light L.

In this semiconductor laser device 100, since the second region 15b as the window region is formed in the region adjacent to four side surfaces of the semiconductor laser device 100 so as to surround the first region 15a as the non-window region, an absorption of the laser light in the window region decreases, and thus, the occurrence of the COD is suppressed. As differences of the disordering and the band gap energies by the atomic vacancy diffusion between the non-window region and the window region becomes larger, the absorption of the laser light in the window region becomes smaller, and thus, the occurrence of the COD is suppressed. For suppressing the occurrence of the COD, the window region may be formed in at least a laser-light-emitting-side end of the semiconductor laser device 100, and window areas may be formed at both facets in the laser-light-emitting direction (z-axis direction).

The semiconductor laser device 100 may have the electric-current-injection width of, for example, 6 μm, and in the semiconductor laser device 100, a single-mode emission may occur at 500 mW or more of optical intensity. In this state, the maximum optical power for every 1 μm of electric current injection width of the semiconductor laser device 100 is 80 mW/μm or more. Alternatively, the semiconductor laser device 100 may be configured in which the electric-current-injection width is, for example, 100 μm, and a multi-mode emission occurs at 11 W or more of optical intensity. In this state, the maximum optical power for every 1 μm of electric current injection width of the semiconductor laser device 100 is 110 mW/μm or more. As described above, since an optical intensity for every unit electric current injection width increases to a great extent in a high output laser, the COD may occur easily. However, since the occurrence of the COD is suppressed in the semiconductor laser device 100 according to the first embodiment, a highly reliable semiconductor laser device may be achieved even under such a high output.

Next, the semiconductor laser device 100 according to the first embodiment will be explained more in concrete.

Figure 5:
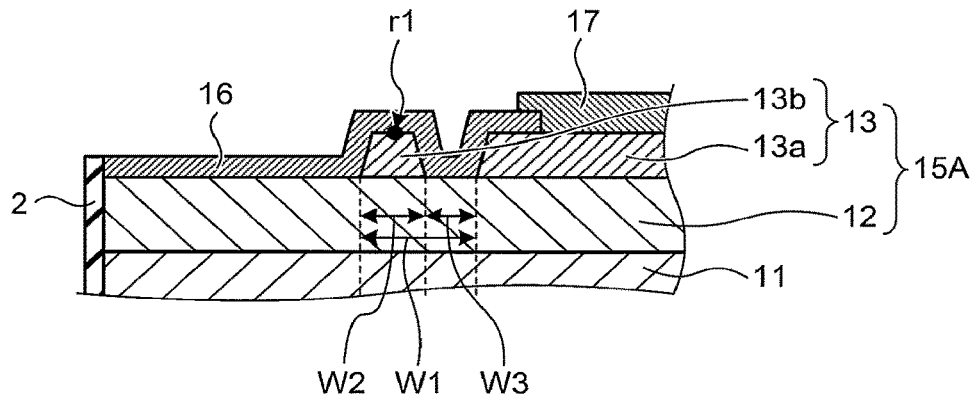
FIG. 5 is a partial enlarged view of FIG. 3.

FIG. 5 is a partial enlarged view of FIG. 3. An outermost region 15A including an outermost surface in the layered direction of the semiconductor layered structure 15 includes: the p-type cladding layer 12 as the lower first impurity layer; and the upper first impurity layer 13 including an upper first impurity layer 13a and an upper first impurity layer 13b which is an island portion isolated from the upper first impurity layer 13a and formed in an island-shape.

As illustrated in in FIGS. 2 and 3 as well, the first region 15a includes the p-type cladding layer 12 and the upper first impurity layer 13. In the first region 15a, the upper first impurity layer 13 (13a) contacts the upper electrode 17. In the second region 15b, the p-type cladding layer 12 is exposed to the outermost surface of the semiconductor layered structure 15. In the third region 15c, the p-type cladding layer 12 is exposed to the outermost surface of the semiconductor layered structure 15 near a boundary between the third region 15c and the first region 15a. As a result, the upper first impurity layer 13 (13b) of the third region 15c is isolated from the upper electrode 17.

That is, the semiconductor laser device 100 has a structure in which the electric-current-injecting region is isolated from the second region 15b which is the window region, and an electric current injections to the second region 15b and the upper first impurity layer 13b are suppressed. If the electric current is injected to the second region 15b, generation of heat may be caused by the injected electric current. Herein, it is known generally that, regarding a semiconductor, when a temperature increases, a band gap is narrowed. Therefore, if the electric current is injected to the second region 15b, the band gap of the second region 15b is narrowed. Then, the difference of the band gap energies between the second region 15b and the first region 15a by the disordering of the active layer 10 may decrease.

The electric-current-injecting region is positioned on the outermost surface at the first region 15a of the semiconductor layered structure 15 and isolated from the second region 15b in the semiconductor laser device 100 according to the first embodiment, and a decrease in the band gap energy difference between the second region 15b and the first region 15a is prevented. Therefore, the semiconductor laser device provided with a greater band gap energy difference may be provided.

Herein, as illustrated in FIGS. 2, 3 and 5, the surface roughness r1 due to the later-described RTA may be formed on the upper first impurity'layer 13b in the third region 15c.

Figure 27:
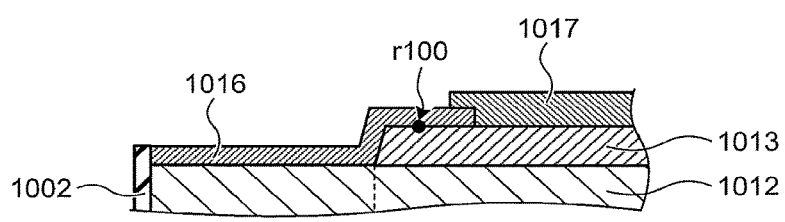
FIG. 27 is a view for explaining an example of semiconductor laser device having surface roughness.

As explained with reference to FIG. 27, when the surface roughness r100 is formed on the surface of the first impurity layer 1013, the semiconductor laser device may be deteriorated by the surface roughness r100.

In the semiconductor laser device 100, the surface roughness r1 exists in the third region 15c. Therefore, when a dislocation progresses, at first the dislocation will reach the active layer 10 in the third region 15c, which is disordered by the RTA. Since the active layer 10 in the third region 15c has been disordered by the RTA, crystallinity is low where the dislocation hardly grows, and therefore, the dislocation hardly reaches the first region 15a. As a result, the semiconductor laser device 100 in which the growth of the dislocation is suppressed is a highly reliable semiconductor laser device.

A width W1 in the z-axis direction of the third region 15c illustrated in FIG. 5 may be broad enough to avoid the dislocation by the surface roughness r1 from reaching the active layer 10 of the first region 15a, and the width W1 may be 5 μm or more. The width W1 corresponds to the length of the active layer 10 in the third region 15c in the z-axis direction. On the other hand, since the semiconductor laser device 100 becomes unnecessarily enlarged in size if the width W1 is too broad, the width W1 may be 50 μm or less. Moreover, since a device length of the semiconductor laser device 100 is approximately of several millimeters, the width W1 may be approximately 0.1% to 10% of the device length.

Although a width W2 in the z-axis direction of the upper first impurity layer 13b in the third region 15c is, for example, 10 μm, the width W2 may be 3 μm or more in terms of a machining accuracy. The width W2 may be narrow enough to have the active layer 10 below the upper first impurity layer 13b sufficiently disordered. A width W3 in the z-axis direction of an region where the p-type cladding layer 12 is exposed in the third region 15c may be broad enough to prevent the dislocation by the surface roughness r1 from reaching the active layer 10 of the first region 15a, and for example, the width W3 may be 2 μm or more.

Moreover, in the semiconductor laser device 100, the upper first impurity layer 13b of the third region 15c illustrated in FIG. 5 is isolated from the upper electrode 17 and the upper first impurity layer 13a in the first region 15a. Therefore, the electric current will not be injected to the surface roughness r1 directly or via the upper first impurity layer 13. Therefore, the progress of the dislocation of the electric current injected to the surface roughness r1 is suppressed, and thus the semiconductor laser device 100 is a highly reliable semiconductor laser device.

Moreover, Zn is diffused in the p-type semiconductor region 14 of the first region 15a and the third region 15c in the semiconductor laser device 100. When a great amount of Zn is doped, a part of the doped Zn exists as an inert atom among gratings in a crystal. This inert atom serves to bury a point defect. Therefore, even if the dislocation caused by the surface roughness r1 progresses in the semiconductor laser device 100, Zn buries the dislocation before the dislocation reaches the active layer 10 in the first region 15a. Therefore, the semiconductor laser device 100 in which the progress of the dislocation is suppressed by Zn burying the dislocation is a highly reliable semiconductor laser device.

Although, in the semiconductor laser device according to the first embodiment, the third region is provided in at least one predetermined direction among directions from the third region to the first region and parallel to the active layer. That is, the third region is provided in not only a waveguide direction (the z-axis direction) of light in the semiconductor laser device but also in a direction (the x-axis direction) orthogonal to the waveguide direction of the light. However, the third region may be provided at least at a part of the z-axis direction. Even if the third region is provided only in a part of the z-axis direction, it is possible to prevent the dislocation by the surface roughness from reaching the active layer in the first region at that part when the length of the active layer in the third region is sufficiently long.

Moreover, when the semiconductor laser device is operated, a laser-light-guiding region having a limited expansion is formed along the z-axis direction within the x-y plane. For example, in the semiconductor laser device 100, a region is formed, in which light is confined in the vicinity of the active layer 10 by the ridge structure in the x-axis direction and by the refractive index difference between the guide layer and the cladding layer in the y-axis direction, and the laser light is guided in the z-axis direction. Since optical energy is supplied to the dislocation in the laser-light-guiding region, the dislocation tends to grow. Therefore, by setting the length of the active layer in the third region in the z-axis direction to 5 µm or more in the x-y plane of the entire laser-light-guiding region, the effect of the present disclosure, preventing deterioration of reliability caused by the surface roughness, may be obtained more evidently.

When cleaving the substrate 5 in the later-described manufacturing process, a flaw may be generated on a cleaved surface, and a dislocation grows if an electric current is injected to the flaw. As in the semiconductor device according to the first embodiment, the dislocation growth from the flaw generated on the cleaved surface may also be suppressed by providing the third region in the x-axis direction, and therefore, a semiconductor laser device with a higher reliability may be obtained.

Figure 6:
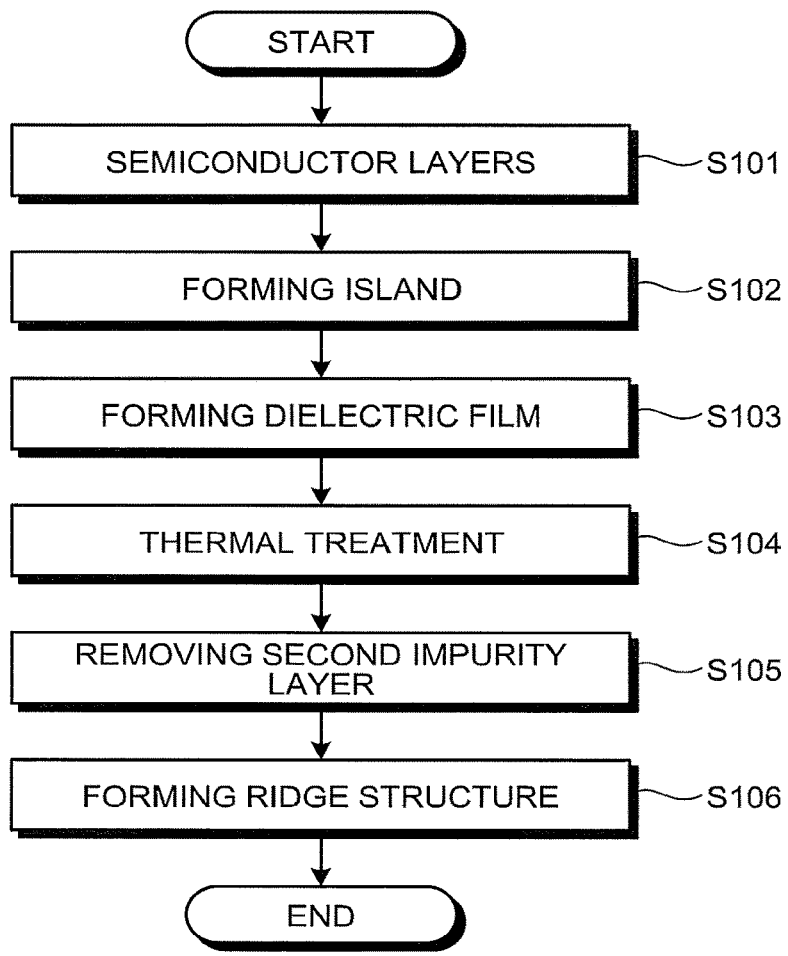
FIG. 6 is a flow chart of a manufacturing method of a semiconductor laser device.

Next, an example of the manufacturing method of the semiconductor laser device 100 will be explained. FIG. 6 is a flow chart of the manufacturing method of the semiconductor laser device. As illustrated in FIG. 6, the manufacturing method of the semiconductor laser device 100 according to the first embodiment includes a semiconductor-layer-forming step (step S101), an island-portion-forming step (step S102), a dielectric-film-forming step (step S103), a thermal treatment step (step S104), a second-impurity-layer-removing step (step S105), and a ridge-structure-forming step (step S106).

Next, each step will be explained. Values presented in the steps are mere examples, and the first embodiment will not be limited to those values.

Semiconductor-Layer-Forming Step

Figure 7:
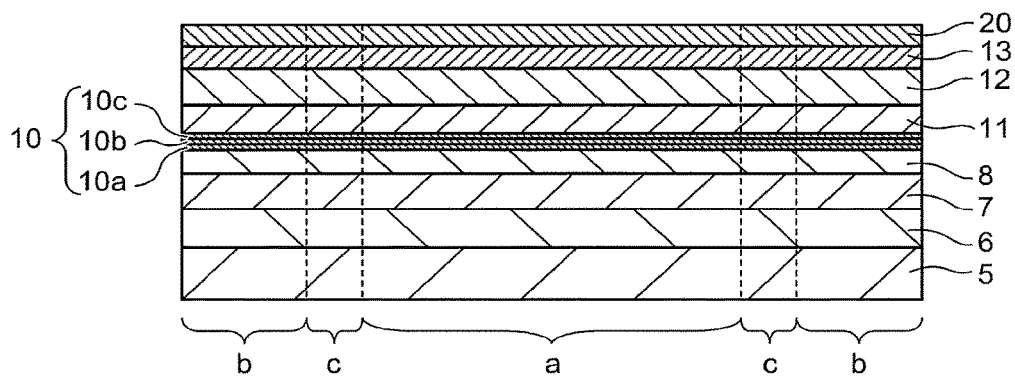
FIG. 7 is a view for explaining an example of the manufacturing method of a semiconductor device according to the first embodiment.

To start with, the semiconductor-layer-forming step in the step S101 will be explained. In this step, as illustrated in FIG. 7, the n-type buffer layer 6, the n-type cladding layer 7, the n-type guide layer 8, the active layer 10, the p-type guide layer 11, the p-type cladding layer 12, the upper first impurity layer 13 and a second impurity layer 20 are epitaxially grown on the substrate 5 by a metal organic chemical vapor deposition (MOCVD) method. Herein the upper first impurity layer 13 is doped with C as the first impurity which is the p-type impurity. The second impurity layer 20 is a layer made of GaAs doped with, for example, approximately $1.0 \times 10^{17}$ to $5.0 \times 10^{19}$ to $5.0 \times 10^{20}$ cm$^{-3}$ of Zn as the second impurity which is the p-type impurity. In FIG. 7, a region to be the first region 15a is illustrated as a region "a", a region to be the second region 15b is illustrated as a region "b", and a region to be the third region 15c is illustrated as a region "c".

Island-Portion-Forming Step

Figure 8:
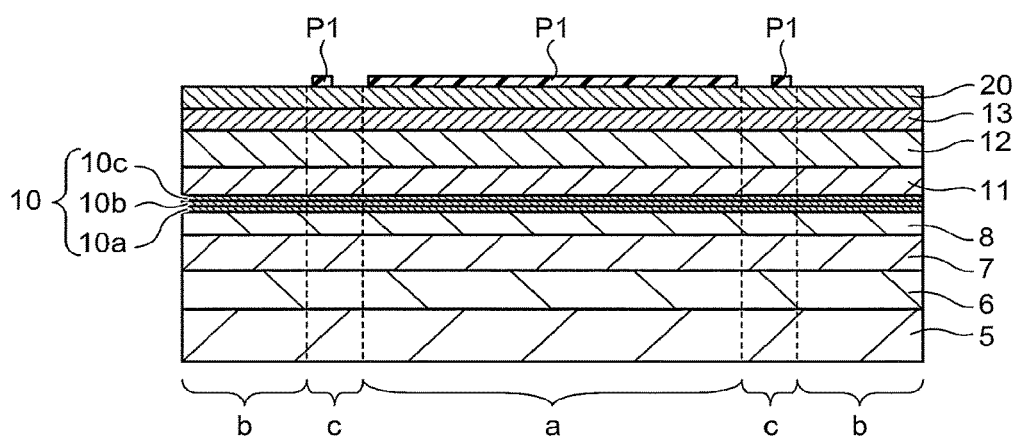
FIG. 8 is a view for explaining the example of the manufacturing method of the semiconductor device according to the first embodiment.
Figure 9:
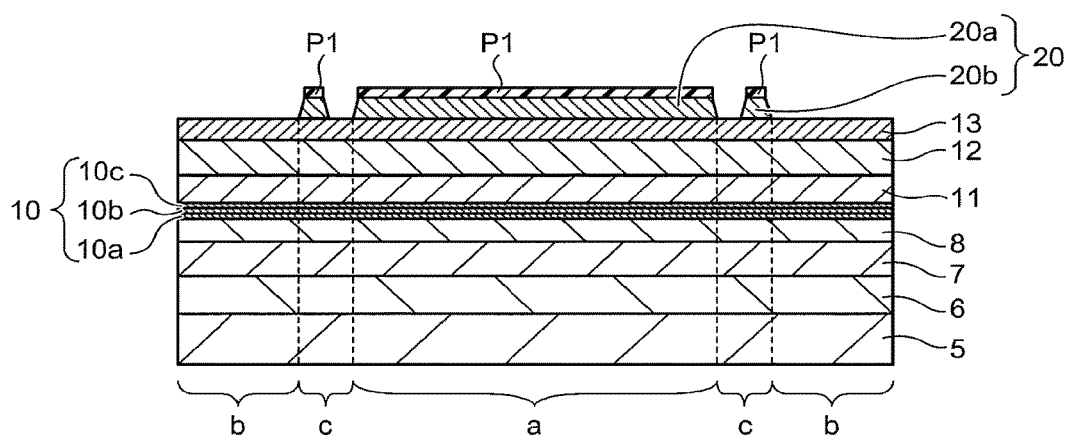
FIG. 9 is a view for explaining the example of the manufacturing method of the semiconductor device according to the first embodiment.

Next, the island-portion-forming step in the step S102 will be explained. In this step at first, a photo-lithography process is performed as illustrated in FIG. 8 to form photo-resists P1 in the region "a" and in a part of the region "c" near the boundary between the regions "b" and "c". Subsequently, an etching process is performed as illustrated in FIG. 9, the second impurity layer 20 is removed from the region "b" and from a part of the region "c" near the boundary between the regions "a" and "c". Moreover, the photo-resists P1 are removed. Hereby, the second impurity layer 20 has a shape including a second impurity layer 20a formed in the region "a" and a second impurity layer 20b which is an island portion isolated from the second impurity layer 20a.

Dielectric-Film-Forming Step

Figure 10:
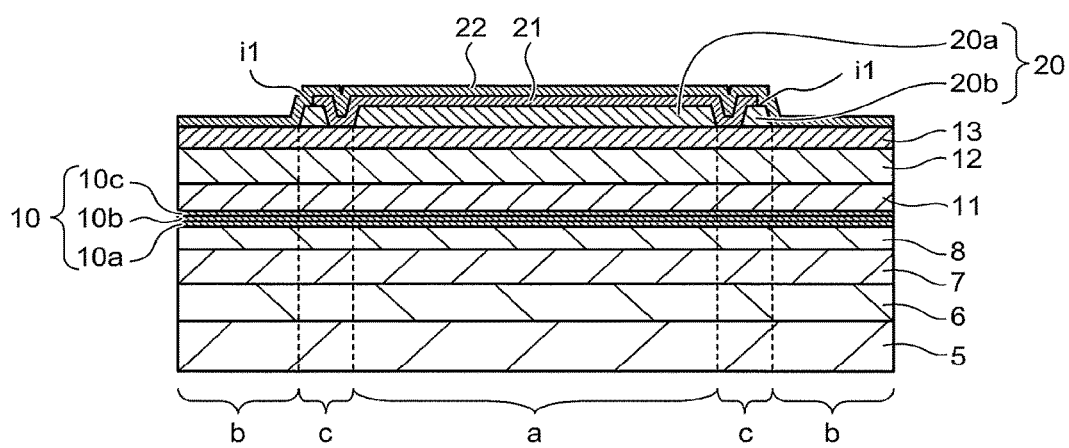
FIG. 10 is a view for explaining the example of the manufacturing method of the semiconductor device according to the first embodiment.

Next, the dielectric-film-forming step in the step S103 will be explained. In this step, the disordering is performed by the atomic vacancy diffusion using the IFVD method, and in order to differentiate the disordering of the first region 15a, the second region 15b and the third region 15c, a dielectric film 21 and a dielectric film 22 are formed. To start with, the dielectric film 21 which is the SiN insulation layer is formed on an upper surface of the semiconductor layered structure 15. Next, as illustrated in FIG. 10, by the photo-lithography step and the etching step, the dielectric film 21 of the region "b" is removed. Subsequently, a dielectric film 22 which is a SiN insulation layer is formed on an entire surface of the upper surface of the semiconductor layered structure 15. Herein, the dielectric film 21 is a dense SiN insulation layer of which refractive index is 2.0 for example, and the dielectric film 22 is a sparse SiN insulation layer of which refractive index is 1.9 for example. The dielectric film 21 functions as the suppression film suppressing the disordering, and the dielectric film 22 functions as the acceleration film accelerating the disordering. However, relationships as to which of the dielectric film 21 and the dielectric film 22 is the dense SiN insulation layer and which is the sparse SiN insulation layer may be switched based on the conditions of the RTA (see Japanese Laid-open Patent Publication No. 6-77596).

In the first embodiment, after forming the suppression film, the suppression film in the region "b" is removed and thereafter the acceleration film is formed. However, after forming the acceleration film, the acceleration films in the region "a" and the region "c" may be removed, and thereafter the suppression film may be formed.

Thermal Treatment Step

Next, the thermal treatment step in the step S104 will be explained. In this step, a short-time thermal treatment is performed by the RTA. When the thermal treatment by the RTA is performed, Ga atom is absorbed by the dielectric film 21 and the dielectric film 22, and the atomic vacancy is formed on surfaces of the upper first impurity layer 13 and the second impurity layer 20. This atomic vacancy diffuses as the diffusion species, and each of the semiconductor layers, particularly the active layer 10, is disordered.

In the region "a" and the region "c", where the dielectric film 21 which is the suppression film is formed to contact the upper first impurity layer 13 and the second impurity layer 20, the disordering of the active layer 10 is suppressed by the dielectric film 21. In contrast to this, in the region "b" where the dielectric film 22 which is the acceleration film is formed to contact the upper first impurity layer 13, the disordering of the active layer 10 is accelerated by the dielectric film 22.

Herein, in parallel to the absorption of the Ga atom by the dielectric film 21 and the dielectric film 22 by RTA in the atomic-vacancy-generating step, a step of accelerating the disordering by doped impurities and a step of suppressing the disordering by doped impurities are progressed. The step of accelerating the disordering is assumed to be caused by the doped impurities accelerating the hole diffusion by thermal diffusion, or assumed that the doped impurities perform thermal diffusion and cause a kick-out phenomenon of the Ga atoms. The step of suppressing the disordering is assumed to be caused by the doped impurities performing the thermal diffusion and burying the atomic vacancy. Although these steps are progressed simultaneously by the RTA, as to which step exerts a dominant effect depends on types and concentrations of the impurities, combination of the impurities, a temperature and time of the RTA, the conditions of the acceleration film and the suppression film, and the like.

Therefore, in the first embodiment, the types and concentrations of the impurities, the combination of the impurities, the temperature and time of the RTA, the conditions of the acceleration film and the suppression film, and the like are optimized so that a difference of the disordering of the active layer 10 of the first region 15a the disordering of and the active layer 10 in the second region 15b increases. In addition, the conditions of the temperature, time, and the like of the RTA are adjusted so that the impurities are not diffused to the active layer 10 by the RTA. This is for preventing deterioration of output properties of the semiconductor laser device by the optical absorption of the impurities introduced to the active layer 10.

Next, the first impurity accelerating the disordering by accelerating one or both of diffusing and generating the atomic vacancy by doping is called an acceleration species, and the second impurity suppressing the disordering by suppressing one or both of diffusing and generating the atomic vacancy by doping is called a suppression species. In this state, along with an increase in the amount of the acceleration species contained in the p-type semiconductor region 14, the disordering is accelerated, and the disordering and the band gap energy increase more. On the other hand, along with an increase in the amount of the suppression species contained in the p-type semiconductor region 14, the disordering is suppressed, and an increase in the disordering and an increase in the band gap energy are suppressed.

In the first embodiment, C which is the first impurity serves as the acceleration species, and Zn which is the second impurity serves as the suppression species. In this state, by removing the second impurity layer 20 by etching, the acceleration of the disordering by C becomes evident in the region "b" in which Zn as the suppression species is reduced. On the other hand, in the region "a" and the region "c" containing more Zn which is the suppression species, the disordering is suppressed by Zn. As described above, by differentiating the contained amounts of the impurities so that more Zn as the suppression species is contained in the p-type semiconductor region 14 in the region "a" and the region "c", the disordering in each region differs, and thus a difference of the band gap energies increases. Therefore, the effect of suppressing the occurrence of the COD becomes evident more than in a case of not differentiating contained amounts of Zn per region.

The active layer 10 on a lower part of the upper first impurity layer 13b is disordered by the atomic vacancy supplied mainly from both sides, in a surface direction, of the upper first impurity layer 13b. Therefore, in the active layer 10 on the lower part (corresponding to the third region 15c) of the upper first impurity layer 13b, as illustrated in FIGS. 2 and 3, the disordering is higher than in the first region 15a and lower than in the second region 15b, and the disordering increases from the first region 15a toward the second region 15b. The width W2 (see FIG. 5) of the upper first impurity layer 13b may not be too wide because a non-disordered region is formed on the lower part of the upper first impurity layer 13b.

By the disordering of the active layer 10 according to the thermal treatment, the atomic vacancy diffusion changes the composition of the SQW and then the band gap energy changes. However, the impurities such as C, Zn, and the like are not doped to the active layer 10 by the thermal treatment. That is, the quantum well layer 10b made of highly pure InGaAs not doped intentionally is disordered by the atomic vacancy diffusion from the lower barrier layer 10a, the upper barrier layer 10c, and the like made of AlGaAs. When the disordering increases as described above, the band gap energy of the active layer 10 increases.

Herein, as illustrated in FIG. 10, a gap is formed at a border portion i1 between the dielectric film 21 and the dielectric film 22, and therefore a region where the dielectric film 22 does not cover the surface of the second impurity layer 20b may be formed. Although there is a case in which a gap is formed at the border portion of each dielectric films and each semiconductor layer, the gap tends to be formed at a portion where a sparse film covers a stepped portion. Since the dielectric film 22 is a sparse film in the first embodiment, a gap tends to be formed especially at the border portion it in which the dielectric film 22 covers a stepped portion of the dielectric film 21. When the RTA is performed when a region not covered with the dielectric film 22 exists as described above, the surface roughness is formed on the surface of the second impurity layer 20b.

Second-Impurity-Layer-Removing Step

Figure 11:
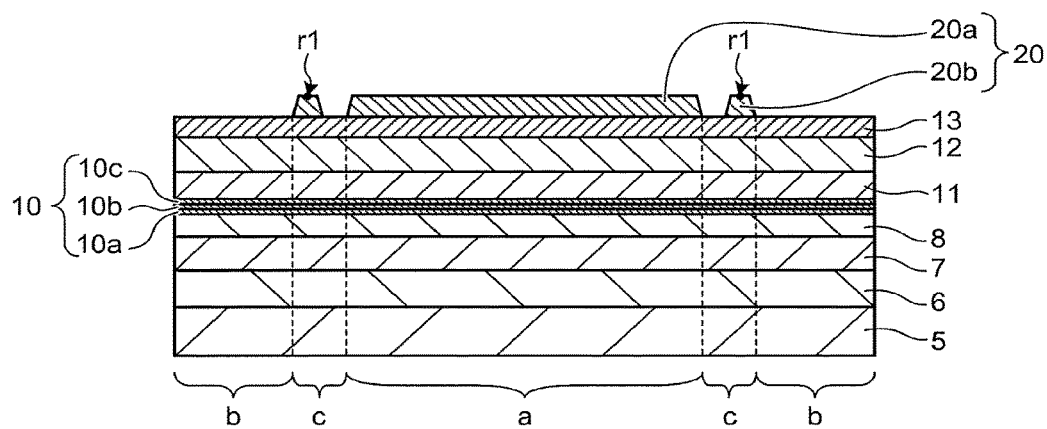
FIG. 11 is a view for explaining the example of the manufacturing method of the semiconductor device according to the first embodiment.
Figure 12:
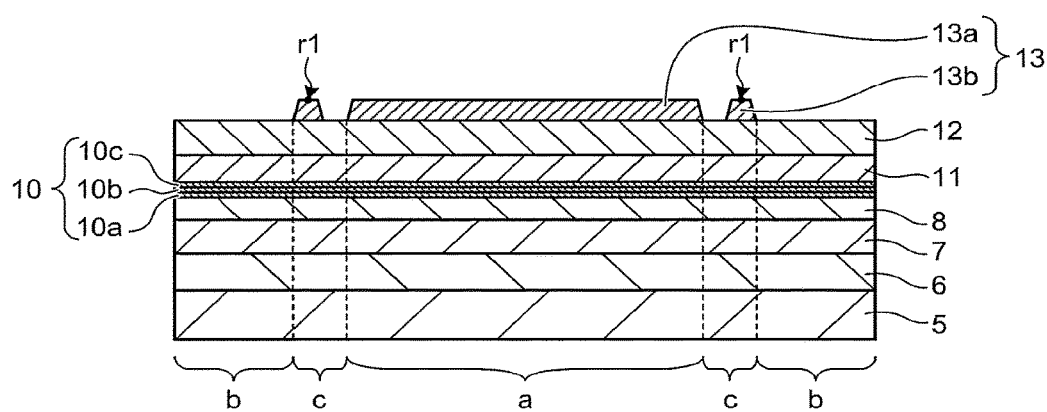
FIG. 12 is a view for explaining the example of the manufacturing method of the semiconductor device according to the first embodiment.

Next, the second-impurity-layer-removing step in the step S105 will be explained. In this step, to start with, as illustrated in FIG. 11, the dielectric film 21 and the dielectric film 22 are removed. On the surface of the second impurity layer 20b in this state, the surface roughness r1 may be formed. Subsequently, as illustrated in FIG. 12, the etching process is performed to remove the second impurity layer 20. In this state, the upper first impurity layer 13 is removed from the parts of the region "b" and the region "c", and the p-type cladding layer 12 is exposed to an outermost surface of the semiconductor layered structure. Then, along with the etching, the surface roughness r1 is transferred from the surface of the second impurity layer 20b to the surface of the upper first impurity layer 13b.

When the concentration of Zn of the second impurity layer 20 is sufficiently high and the conductivity is high based on the conditions for doping and the RTA, the second-impurity-layer-removing step may be omitted, and the second impurity layer 20 may be used as the contact layer. In that case, the second impurity layer 20 of the manufactured semiconductor laser device is supposed to include the second impurity layer 20a and the second impurity layer 20b being an island portion isolated from the second impurity layer 20a.

Ridge-Structure-Forming Step

Figure 13:
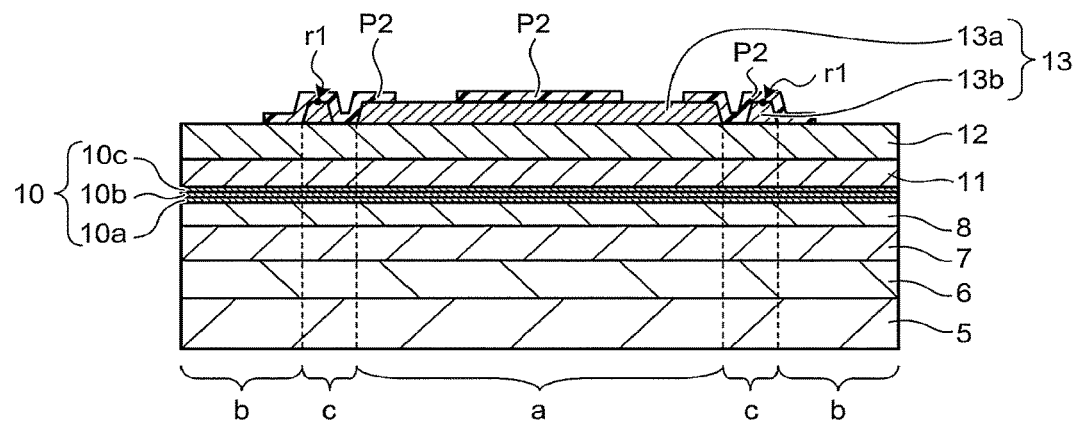
FIG. 13 is a view for explaining the example of the manufacturing method of the semiconductor device according to the first embodiment.
Figure 14:
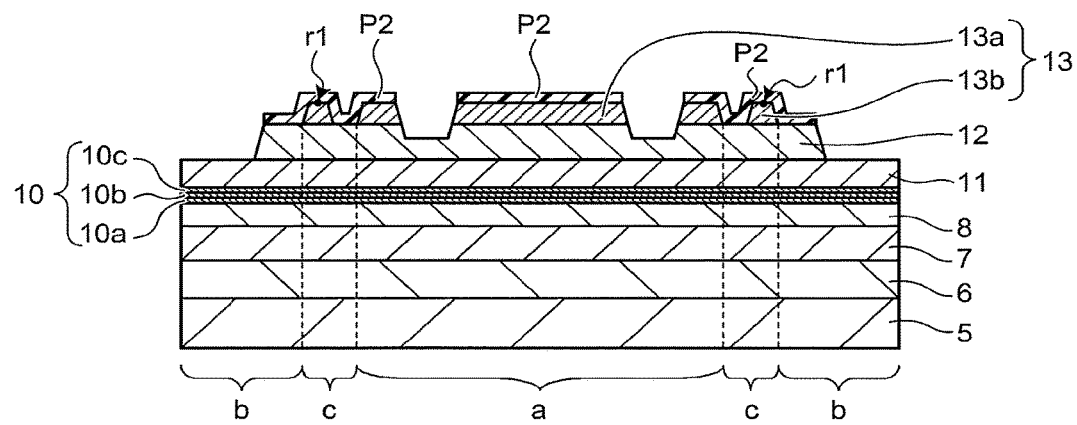
FIG. 14 is a view for explaining the example of the manufacturing method of the semiconductor device according to the first embodiment.

Next, the ridge-structure-forming step in the step S106 will be explained. In this step, as illustrated in FIG. 13, photo-resists P2 in a striped pattern are formed to form the ridge structure and the support mesa structure on the p-type cladding layer 12 and the upper first impurity layer 13 by the photo-lithography process. Next, as illustrated in FIG. 14, the p-type cladding layer 12 and the upper first impurity layer 13 are etched into a trapezoid shape. Also, a structure to be the support mesa structure sandwiching a trapezoid portion is formed. Thereafter, the photo-resists P2 are removed to form the ridge structure having the support mesa structure. Moreover, the insulation film 16 is formed, and the photo-lithography process and the etching process are performed, thus, the aperture portion 16a for contacting the upper electrode 17 to the upper first impurity layer 13 is formed. Thereafter, the upper electrode 17 and the lower electrode 4 on the bottom surface of the substrate 5 are formed, the substrate 5 is cleaved, the low reflectivity film 2 and the high reflectivity film 3 are formed on the cleaved surface, and then, by cutting it into devices, the semiconductor laser device 100 is manufactured.

As described above, although the surface roughness r1 may become an origination of the dislocation, the growth of the dislocation is suppressed by the third region 15c and the like.

In addition, when cleaving the substrate 5, a flaw may be formed on the cleaved surface, and if an electric current is injected to the flaw, the dislocation grows. In order to prevent the growth of the dislocation as such, the window regions are formed also on both ends in the x-axis direction of the semiconductor laser device 100.

As described above, the semiconductor laser device 100 according to the first embodiment is a highly reliable semiconductor device wherein a progression and growth of the dislocation caused by the surface roughness r1 are suppressed. That is, since the surface roughness r1 which is the region causing a failure mode and which is positioned at a part of the third region near the second region is isolated from the first region which is the non-window region, a failure caused by the failure mode originated from the surface roughness r1 may be suppressed.

Second Embodiment

Figure 15:
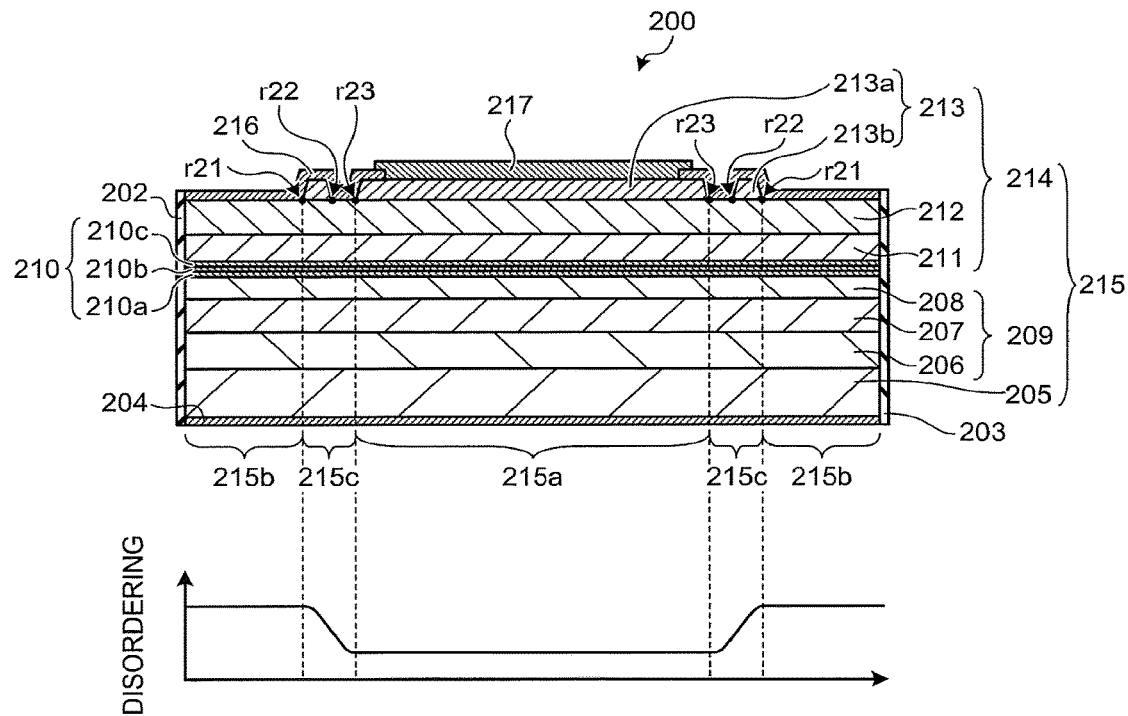
FIG. 15 illustrates a cross section in a y-z plane and disordering of a semiconductor device according to a second embodiment.

Next, a semiconductor device according to a second embodiment of the present disclosure will be explained. The semiconductor device according to the second embodiment is a semiconductor laser device having the same structure as the semiconductor laser device 100 according to the first embodiment. FIG. 15 illustrates a cross section in the y-z plane and disordering of the semiconductor device according to the second embodiment. As illustrated in FIG. 15, the semiconductor laser device 200 includes a low reflectivity film 202 and a high reflectivity film 203 forming a cavity. Moreover, the semiconductor laser device 200 includes a semiconductor layered structure 215 including: a n-type semiconductor region 209 including an n-type buffer layer 206, an n-type cladding layer 207, and an n-type guide layer 208; an active layer 210 including a lower barrier layer 210a, a quantum well layer 210b, and an upper barrier layer 210c; and a p-type semiconductor region 214 including a p-type guide layer 211, a p-type cladding layer 212, and an upper first impurity layer 213 including an upper first impurity layer 213a and an upper first impurity layer 213b. The semiconductor layered structure 215 is formed in that order on a substrate 205 including a lower electrode 204 formed on a bottom surface thereof. The semiconductor laser device 200 includes an insulation film 216 and an upper electrode 217 formed on the semiconductor layered structure 215.

Similarly to the first embodiment, the semiconductor layered structure 215 includes a first region 215a, a second region 215b whose disordering is higher than the first region 215a, and a third region 215c whose disordering is higher than the first region 215a and lower than the second region 215b, and at least a length of the active layer 210 in the third region 215c in the z-axis direction is 5 µm or more.

Similarly to the first embodiment, the semiconductor laser device 200 emits light by applying a voltage between the lower electrode 204 and the upper electrode 217 and injecting a carrier to the active layer 210 from the n-type semiconductor region 209 and the p-type semiconductor region 214. The emitted light makes laser emission by an optical amplification effect of the active layer 210 and an optical cavity formed by the low reflectivity film 202 and the high reflectivity film 203.

Herein, in the semiconductor laser device 200, a surface roughness r21, a surface roughness r22, and a surface roughness r23 may be formed in the later-described manufacturing process. As to how each surface roughness act when driving this semiconductor laser device 200 will be explained.

First of all, the crystallinity of the surface roughness r21 is low since the active layer 210 immediately therebeneath is disordered, the dislocation hardly grows in the active layer 210 and hardly reaches the first region 215a even if the dislocation reaches the active layer 210 from the surface roughness r21. Then, the surface roughness r22 and the surface roughness r23 exist in the first region 215a and the third region 215c containing Zn serving as an inert atom in the crystal. Therefore, even if the dislocation progresses from the surface roughness r22 and the surface roughness r23 to the active layer 210, they are buried easily by Zn before the dislocation reaches the active layer 210 in the first region 215a. As a result, the semiconductor laser device 200 according to the second embodiment is a highly reliable semiconductor device.

Figure 16:
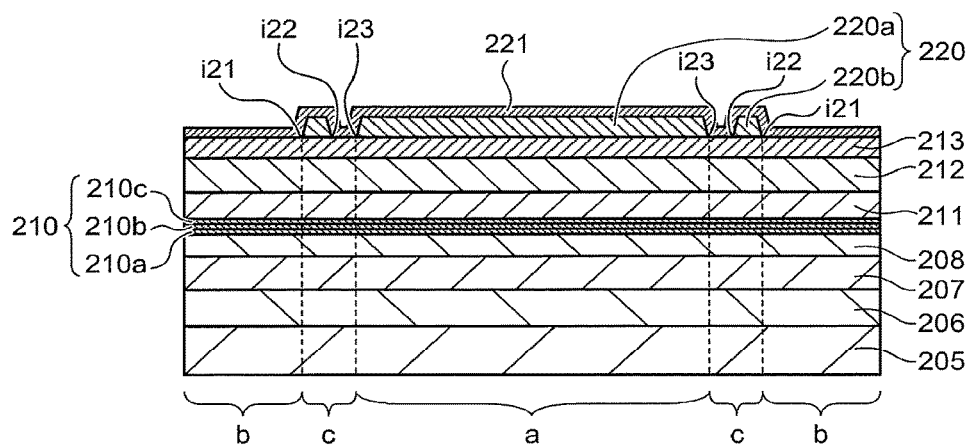
FIG. 16 is a view for explaining an example of a manufacturing method of a semiconductor device according to the second embodiment.

Next, an example of the manufacturing method of the semiconductor laser device 200 will be explained. To start with, similarly to the first embodiment, the semiconductor layers are layered by the semiconductor-layer-forming step, and a second impurity layer is formed into an island shape by the island-portion-forming step. FIG. 16 is a view for explaining the example of the manufacturing method of the semiconductor device according to the second embodiment. As illustrated in FIG. 16, in the manufacturing method of the semiconductor laser device 200 according to the second embodiment, only a layer of a dielectric film 221 is formed on an upper surface of the semiconductor layered structure in the dielectric-film-forming step. In this state, a border portion between the dielectric films as in the first embodiment is not formed. However, since a second impurity layer 220 includes a second impurity layer 220a and an island-shaped second impurity layer 220b, stepped portions are formed at a border portion i21, a border portion i22, and a border portion i23 which are border portions between the upper first impurity layer 213 and the second impurity layer 220. When the dielectric film 221 covers the stepped portions, gaps are formed, and a region in which the dielectric film 221 does not cover the surfaces of the upper first impurity layer 213 and the second impurity layer 220 may be formed.

Then, when performing the short-time thermal treatment by the RTA in the thermal treatment step, the surface roughness r21, the surface roughness r22 and the surface roughness r23 may be formed in the respective border portions. Although the dislocations may originate from the surface roughness, the growth of the dislocation is suppressed by the third region 215c and the like.

Thereafter, similarly to the first embodiment, the second-impurity-layer-removing step and the ridge-structure-forming step are performed, thus the semiconductor laser device 200 is manufactured.

Third Embodiment

Figure 17:
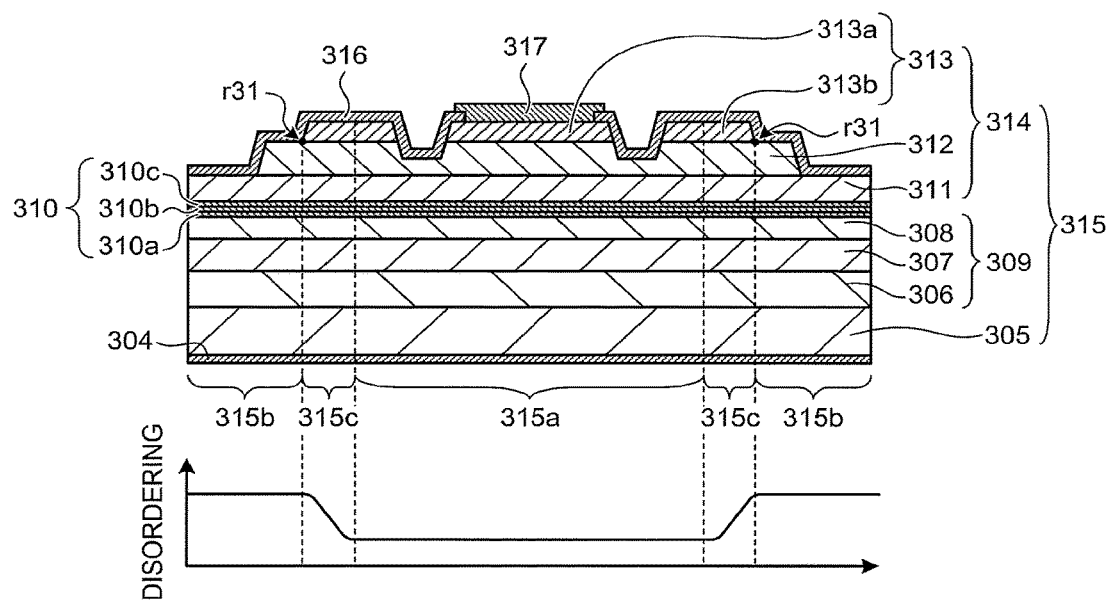
FIG. 17 illustrates a cross section in an x-y plane and disordering of a semiconductor device according to a third embodiment.
Figure 18:
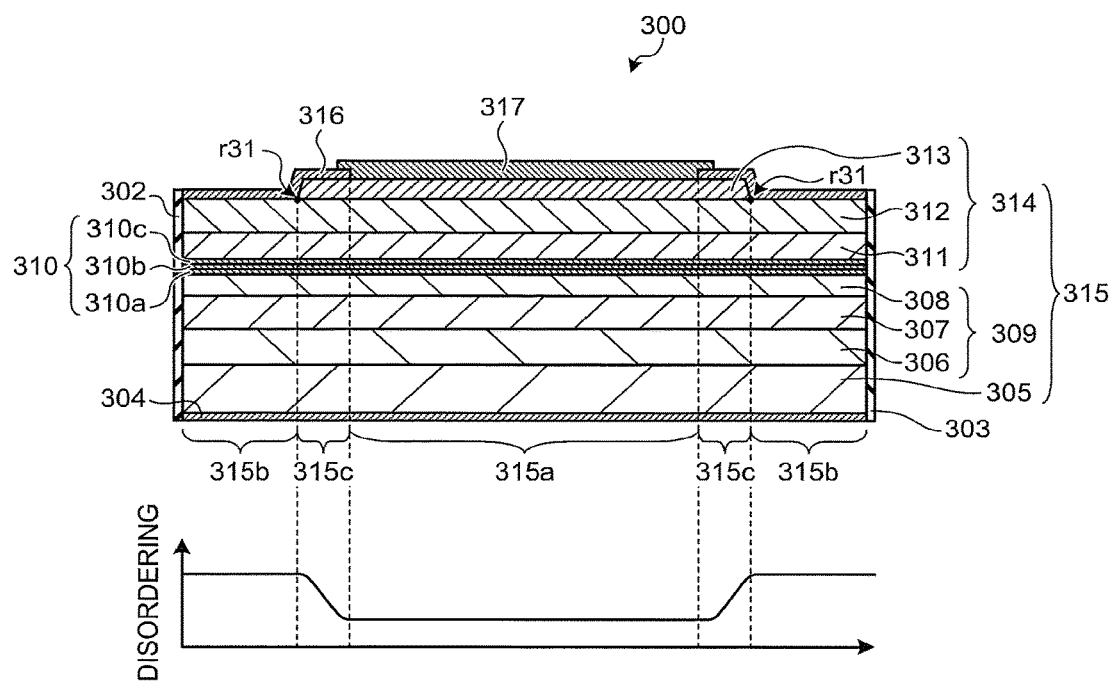
FIG. 18 illustrates a cross section in a y-z plane and disordering of the semiconductor device according to the third embodiment.

Next, a semiconductor device according to a third embodiment of the present disclosure will be explained. Similarly to the first embodiment, the semiconductor device according to the third embodiment is a semiconductor laser device having a ridge structure. FIGS. 17 and 18 are views illustrating cross sections in the x-y plane and the y-z plane and the disordering of the semiconductor laser device according to the third embodiment. As illustrated in FIGS. 17 and 18, the semiconductor laser device 300 includes a low reflectivity film 302 and a high reflectivity film 303 forming a cavity. Moreover, the semiconductor laser device 300 includes a semiconductor layered structure 315 including: an n-type semiconductor region 309 including an n-type buffer layer 306, an n-type cladding layer 307, and an n-type guide layer 308; an active layer 310 including a lower barrier layer 310a, a quantum well layer 310b, and an upper barrier layer 310c; and a p-type semiconductor region 314 including a p-type guide layer 311, a p-type cladding layer 312, and an upper first impurity layer 313 including an upper first impurity layer 313a and an upper first impurity layer 313b. The semiconductor layered structure 315 is formed in that order on a substrate 305 including a lower electrode 304 formed on a bottom surface thereof. The semiconductor laser device 300 includes an insulation film 316 and an upper electrode 317 formed on the semiconductor layered structure 315.

Similarly to the first embodiment, the semiconductor layered structure 315 includes a first region 315a, a second region 315b whose disordering is higher than the first region 315a, and a third region 315c whose disordering is higher than the first region 315a and lower than the second region 315b, and at least a length of the active layer 310 in the third region 315c in the z-axis direction is 5 μm or more.

Unlike the first embodiment, the upper first impurity layer 313 of the semiconductor laser device 300 does not include an island portion.

Similarly to the first embodiment, the semiconductor laser device 300 emits light by applying a voltage between the lower electrode 304 and the upper electrode 317 and injecting a carrier to the active layer 310 from the n-type semiconductor region 309 and the p-type semiconductor region 314. The emitted light makes laser emission by an optical amplification effect of the active layer 310 and an optical cavity formed by the low reflectivity film 302 and the high reflectivity film 303.

Herein, in the semiconductor laser device 300, a surface roughness r31 may be formed in the later-described manufacturing process. When driving the semiconductor laser device 300, the crystallinity of the surface roughness r31 is low since the active layer 310 immediately is disordered, the dislocation hardly grows in the active layer 310 and hardly reaches the first region 315a even if the dislocation reaches the active layer 310 from the surface roughness r31. Therefore, the semiconductor laser device 300 according to the third embodiment is a highly reliable semiconductor device.

Figure 19:
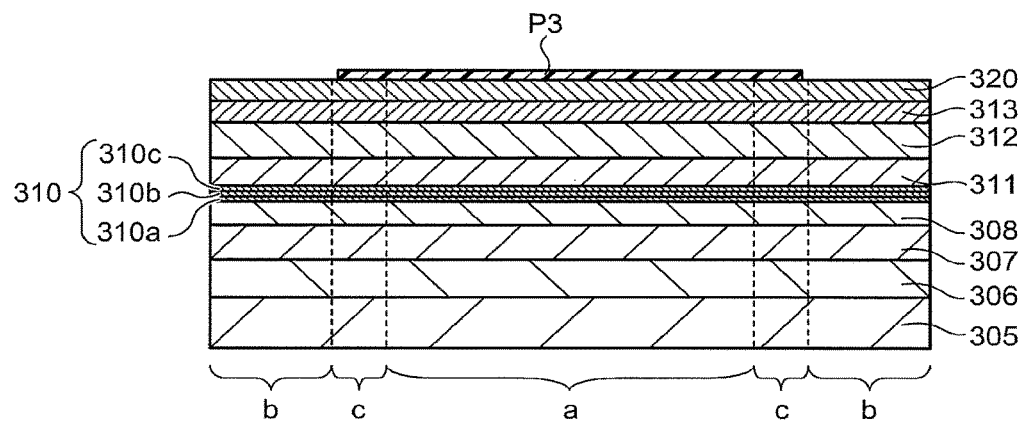
FIG. 19 is a view for explaining an example of a manufacturing method of a semiconductor device according to the third embodiment.
Figure 20:
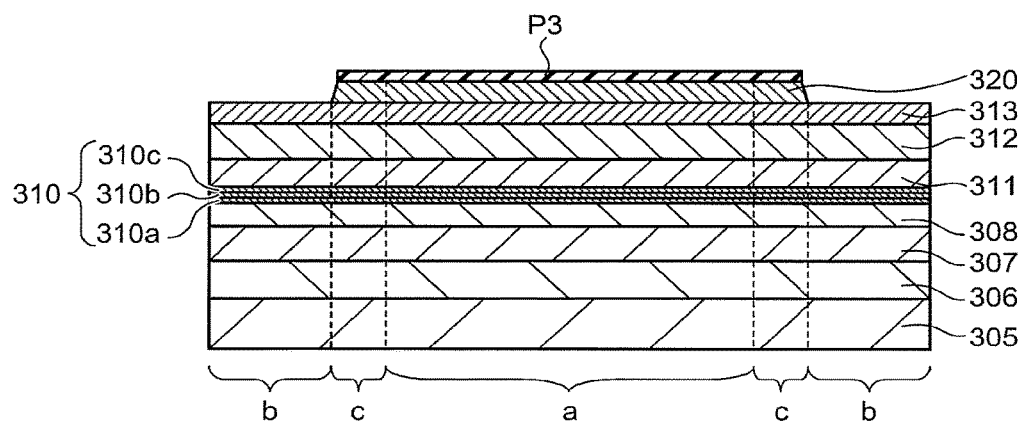
FIG. 20 is a view for explaining the example of the manufacturing method of the semiconductor device according to the third embodiment.

Next, an example of the manufacturing method of this semiconductor laser device 300 will be explained. FIGS. 19 to 25 are views explaining the example of the manufacturing method of the semiconductor device according to the third embodiment. To start with, similarly to the first embodiment, the semiconductor layers are layered by the semiconductor-layer-forming step, but the island-portion-forming step is not performed. Therefore, as illustrated in FIG. 19, a second impurity layer 320 does not include an island portion. Subsequently, a photo-resist P3 is formed on a surface of the second impurity layer 320 in a region "a" to be the first region 315a and a region "c" to be the third region 315c. Then, as illustrated in FIG. 20, the etching process is performed to remove a second impurity layer 20 in a region "b" to be the second region 315b. Thereafter, the photo-resist P3 is removed.

Figure 21:
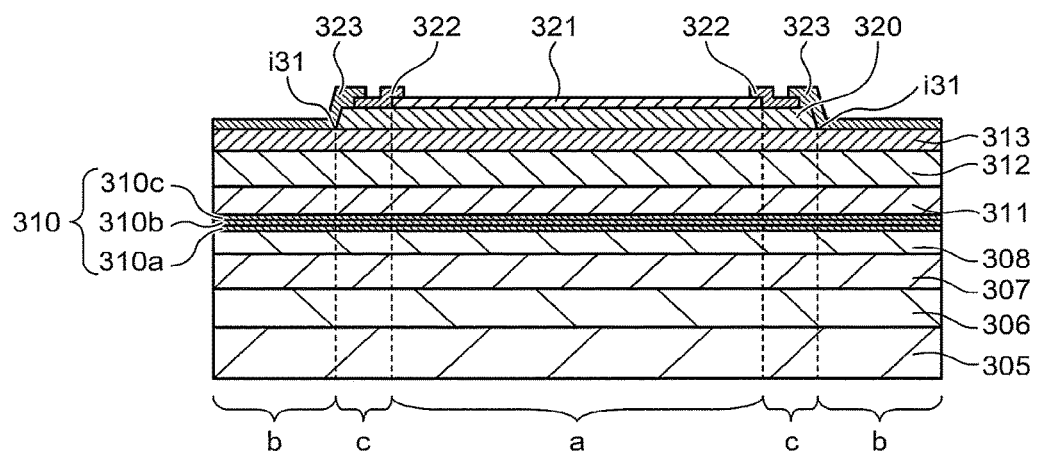
FIG. 21 is a view for explaining the example of the manufacturing method of the semiconductor device according to the third embodiment.

Next, in the dielectric-film-forming step, a dielectric film 321 is formed on the surface of the region "a" as illustrated in FIG. 21, a dielectric film 322 is formed on the surface of the region "c", and a dielectric film 323 is formed on the surface of the region "b". Herein, the dielectric film 322 is a SiN insulation layer which is sparser than the dielectric film 321, and the dielectric film 323 is a SiN insulation layer which is sparser than the dielectric film 322. In this state, if an influence of the surface roughness is supposed to be more evident by the border portion between the semiconductor layers than by the border portion between the dielectric films based on conditions of each semiconductor layer and each dielectric film, it is supposed to be better if the surface roughness caused by the border portion i31 is considered mainly, and thus, the third embodiment is supposed to be applicable to this case.

Figure 22:
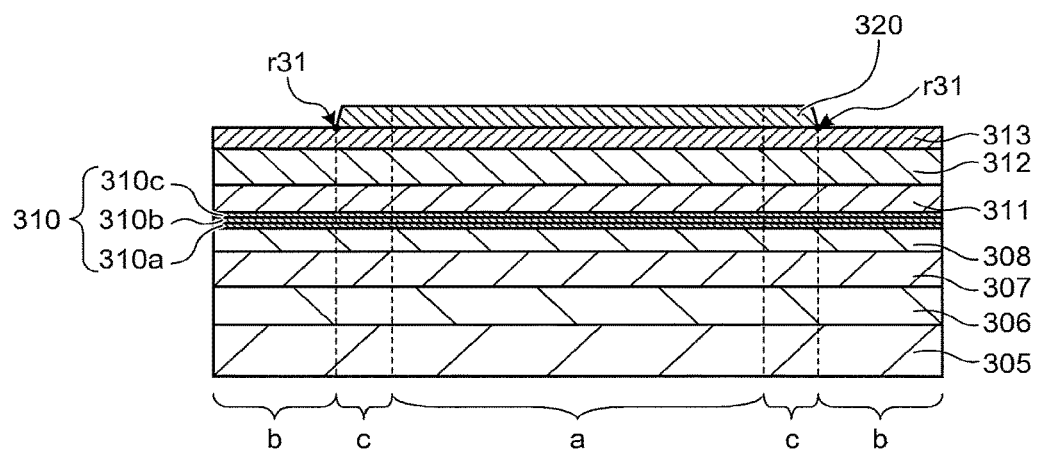
FIG. 22 is a view for explaining the example of the manufacturing method of the semiconductor device according to the third embodiment.
Figure 23:
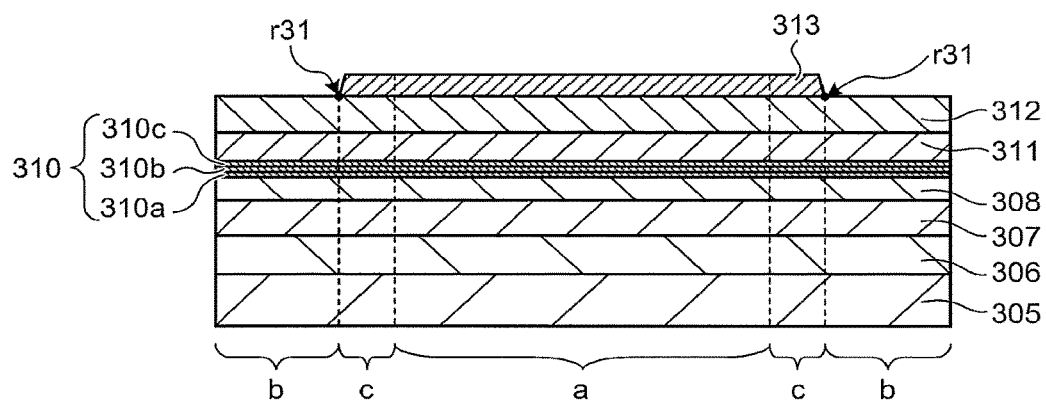
FIG. 23 is a view for explaining the example of the manufacturing method of the semiconductor device according to the third embodiment.
Figure 24:
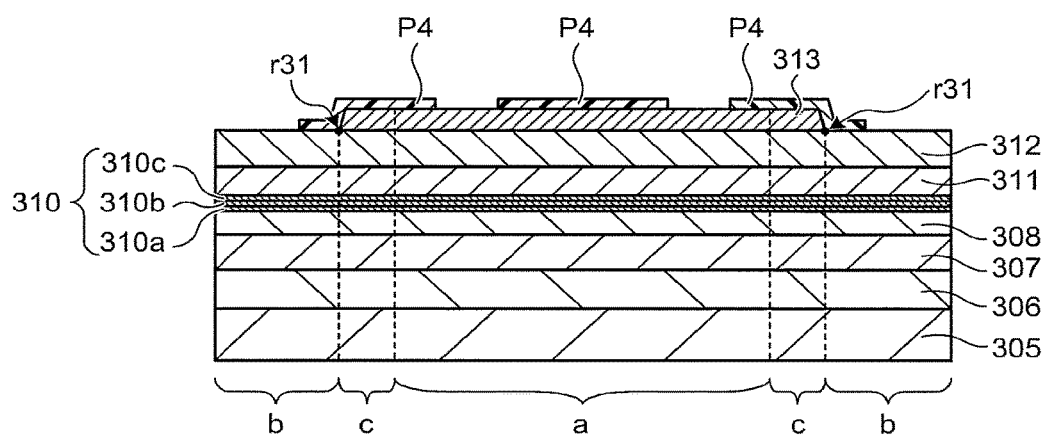
FIG. 24 is a view for explaining the example of the manufacturing method of the semiconductor device according to the third embodiment.
Figure 25:
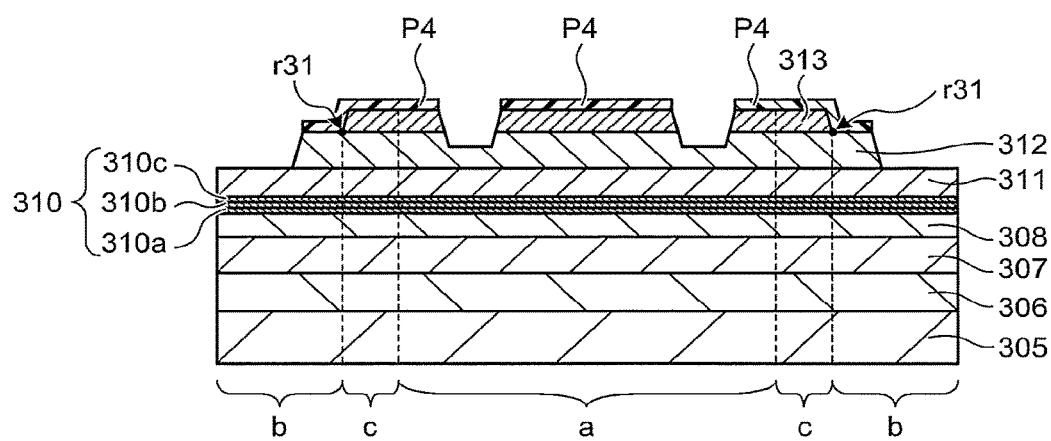
FIG. 25 is a view for explaining the example of the manufacturing method of the semiconductor device according to the third embodiment.
Figure 26:
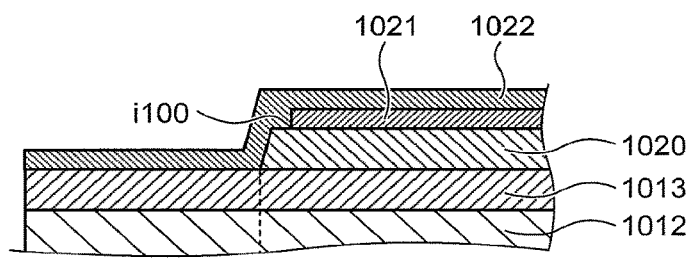
FIG. 26 is a view for explaining an example of disordering by atomic vacancy diffusion.

Next, when performing the short-time thermal treatment by the RTA in the thermal treatment step, the surface roughness r31 may be formed. Although the dislocation may originate from this surface roughness r31, the growth of the dislocation is suppressed by the third region 315c and the like. Thereafter, as illustrated in FIG. 22, the dielectric film 321, the dielectric film 322, and the dielectric film 323 are removed. Then, the second-impurity-layer-removing step similar to the first embodiment is performed as illustrated in FIG. 23, and the ridge-structure-forming step is performed by forming photo-resists P4 as illustrated in FIGS. 24 and 25 similarly to the first embodiment, hereby the semiconductor laser device 300 is manufactured.

As described above, according to the embodiments, a highly reliable semiconductor device may be provided. For example, in the embodiments of the present disclosure, a failure mode originating from a vicinity of the border between the window region and the non-window region is not observed.

Although, in the above-described embodiments, two layers, i.e., the upper first impurity layer containing the first impurity and the second impurity layer containing the second impurity are formed in the manufacturing process, only a layer containing one of the impurities may be formed. In such a case as well, it is possible to differentiate the disordering between the first region and the second region by differentiating thicknesses of the impurity layers between, for example, the first region and the second region to differentiate contained amounts of the impurities. Alternatively, by forming the dielectric films having different refractive indices in the first region and the second region, it is possible to differentiate the disordering between the first region and the second region. When differentiating the disordering between the first region and the second region by these methods, since the border portion will be formed between the dielectric films or between the semiconductor layer, a third region whose disordering is higher than the first region and lower than the second region may be formed in a region including this border portion.

Although, in the above-described embodiment, in order to make the disordering of each region different from other regions, the second impurity layer in the second region is removed by the etching such that a relationship of $C21$ $C23$ $C22$ is satisfied where $C21$ indicates a contained amount of the second impurity in the first region, $C22$ indicates a contained amount of the second impurity in the second region, and $C23$ indicates a contained amount of the second impurity in the third region, the present disclosure is not limited to this. For example, the upper first impurity layer in the first region may be removed by etching such that a relationship of $C12 \geq C13 \geq C11$ is satisfied where $C11$ indicates a contained amount of the first impurity in the first region, $C12$ indicates a contained amount of the first impurity in the second region, and C13 indicates a contained amount of the first impurity in the third region. Both contained amounts of the first impurity and the second impurity may be different from each other.

Although, in the above-described embodiments, the disordering of each region is differentiated from other regions by etching the layers containing impurities, the present disclosure is not limited to this. For example, the contained amount of the impurities in each region may differ from other regions by ion injection. In this case, for example, the third region whose disordering is higher than the first region and lower than the second region may be formed in the region including the border portion between dielectric films.

Although, in the above-described embodiments, the boundary between the first region and the boundary and the boundary between the second region and the third region are planes along the y-axis, the present disclosure is not limited to this. Each boundary may include an inclined surface and a curved surface based on conditions of layering the semiconductor layers and performing the RTA. In this case, since the width in the z-axis direction of the third region is not fixed, a length of the active layer in the third region may be, for example, 5 µm or more. In this state, it is possible to prevent the dislocation due to the surface roughness formed on the surface of the third region from reaching the active layer in the first region, thus the effect of the present disclosure may be obtained.

Although, in the above-described embodiments, the examples of manufacturing the semiconductor laser devices as the semiconductor device are explained, the present disclosure is not limited to this, and the present disclosure may be applied to a manufacturing of semiconductor optical waveguides and semiconductor devices as electronic devices such as, transistors, diodes, and the likes. When the manufacturing processes of these devices include the RTA, the present disclosure is capable of suppressing a failure of devices due to the surface roughness caused by the RTA. The effect of the present disclosure may be obtained by the semiconductor device as well similarly to the above-described embodiments since the semiconductor layered structure includes the first region extending in the layered direction including a part of the active layer, the second region including at least a part of an end portion of the active layer and extending in the layered direction, and the third region including a part of the active layer between the first region and the second region and extending in the layered direction, the disordering of the second region is higher than the first region by the atomic vacancy diffusion, the disordering of the third region is higher than the first region by the atomic vacancy diffusion and is lower than the second region by the atomic vacancy diffusion, a length of the active layer in the third region in at least a predetermined direction among directions from the third region to the first region in parallel with the active layer is 5 µm or more.

In contrast to the above-described embodiments in which the electric current injection is performed to the semiconductor laser device along one direction of the z-axis direction, a two-dimensional electric current injection may be performed to the active layer (semiconductor layer) in the first region. Since an electric-current-injecting region expands in two-dimensionally in the semiconductor device in this state, the third region may be formed to surround the first region, and the length of the active layer in the third region may be 5 µm or more in any direction from the third region to the first region in parallel with the active layer. As a result, it is possible to prevent the dislocation due to the surface roughness formed on the surface of the third region in any direction from reaching the active layer in the first region, and thus, the effect of the present disclosure may be obtained more evidently.

Although, in the above-described embodiments, the outermost surface of the semiconductor layer contacts the dielectric film made of $SiN_x$ in the thermal treatment, the present disclosure is not limited to this. $SiO_x$, $ZnO_x$, $AlO_x$, $AlN_x$, $AlO_xN_y$, $TiO_x$, $TiN_x$, $TiO_xN_y$, $TaO_x$, $HfO_x$, and the like may be used as the dielectric film. When forming the surface of the semiconductor layer to be a uniform medium as disclosed in the second embodiment, regions having different disordering may be formed by forming Ti, Ta, Al, Au, Ni, Zn, Pt, and the like as a metal film and Si, Ge, GaAs, AlGaAs, GaN, AlGaN, ZnSe, and the like as a semiconductor film and performing a thermal treatment. Moreover, the second embodiment is not limited to a uniform film, and regions having different disordering may be formed by contacting the outermost surface of the semiconductor layer with a uniform medium and a uniform gaseous atmosphere such as $N_2$, As, As compound such as arsine and the like, and Ar, and by performing a thermal treatment in the gaseous atmosphere.

Although, in the first embodiment and the third embodiment, the active layer is made to be more likely disordered by the thermal treatment in the second region than in the first region by the dielectric films having different refractive indices, it is possible to have the active layer in the second region disordered by the thermal treatment more easily than the first region by differentiating surface roughnesses of the outermost surfaces contacting the dielectric film of the semiconductor layer.

Although, the above-described embodiments have been explained with C and Zn as examples of the p-type impurity, the first impurity may be Si, Ge, Sn, S, Se, and the like, the second impurity may be Mg, Be, and the like, and two or more impurities from each of the first impurity and the second impurity may be doped.

Although, the above-described embodiments have been explained with the semiconductor laser device having the ridge structure as an example, the embodiments may be applied to devices other than the semiconductor laser device having the ridge structure. Although, in the above-described embodiments, the structure in which the n-type buffer layer 6, the n-type cladding layer 7, the n-type guide layer 8, the active layer 10, the p-type guide layer 11, and the p-type cladding layer 12 are formed on the substrate 5 has been explained, the structure may be a structure in which a p-type buffer layer, a p-type cladding layer, a p-type guide layer, an active layer, an n-type guide layer, and an n-type cladding layer are formed on a substrate. In this case, the contained amounts of the impurities regarding the n-type dopants in the n-type semiconductor region in the first region and the second region may be different from each other. Si, C, Ge, Sn, S, Se and the like may be used as the n-type dopant.

Moreover, the layered structure may be formed by a substrate made of other material such as InP and the like or by a layered structure made of other material in accordance with desirable emission wavelength.

The present disclosure is not limited to the above-described embodiments. The present disclosure includes a configuration appropriately combining the above-described elements. Further effects or modification examples may be derived by an ordinary skilled person in the art easily. Therefore, further wide aspects of the present disclosure are not limited to the specific, detailed, and various modifications may be made.

In the above-described embodiments, the shape of variation in disordering in the third region is not limited to the shapes as illustrated in FIGS. 2, 3, 15, 17, and 18. The variations of the disordering in the third region may be in any shape such as a tapered shape, stepped shape, a shape in which the value decrease rapidly in the vicinity of the first region, a shape in which the value repeatedly increases and decreases, and the like, as long as the value varies from the same value as the disordering in the second region near the boundary between the third region and the second region to the same value as the disordering in the first region near the boundary between the third region and the first region in any direction from the boundary between the third region and the second region toward the boundary between the third region and the first region in parallel to the active layer. The present disclosure is not limited to the disordering by the atomic vacancy diffusion and may be applied to a semiconductor device disordered by using other mechanism. For example, the present disclosure may be applied to also a semiconductor device disordered by using impurity diffusion by ion injection, impurity diffusion in which an impurity layer is diffused by a thermal treatment, and the like. As typical examples for the impurity diffused, there are Si and Zn.

According to the present disclosure, it is possible to achieve a highly reliable semiconductor device suppressing a failure mode as an origination near the window region and the non-window region.

What is claimed is:

1. A semiconductor device comprising:
   a semiconductor layered structure including
      an active layer,
      a first region including a part of the active layer and extending in a layered direction,
      a second region including at least a part of an end portion of the active layer and extending in the layered direction, disordering of the second region being higher than the first region, and
      a third region including a portion of the active layer between the first region and the second region and extending in the layered direction, disordering of the third region being higher than the first region and lower than the second region; and
   an electrode configured to inject an electric current to the active layer, wherein
   the semiconductor layered structure includes an upper impurity layer doped with an impurity in an outermost region in the layered direction, and a lower impurity layer formed between the active layer and the upper impurity layer, the lower impurity layer having lower impurity concentration than the upper impurity layer,
   at least the outermost region of the first region and the third region has the upper impurity layer,
   the lower impurity layer is exposed from an outermost surface of the semiconductor layered structure in at least a part of the second region, and
   the lower impurity layer is exposed from the outermost surface of the semiconductor layered structure in the third region near a boundary of the third region and the first region.

2. The semiconductor device according to claim 1, wherein a failure-mode-generating region is positioned near the second region in the third region, and a failure due to a failure mode originating from the failure-mode-generating region is suppressed.

3. The semiconductor device according to claim 1, wherein
   the upper impurity layer is an upper first impurity layer doped with a first impurity accelerating disordering, and
   the lower impurity layer is a lower first impurity layer whose concentration of the first impurity is lower than the upper first impurity layer.

4. The semiconductor device according to claim 1, wherein a width, in a predetermined direction, of the upper impurity layer in the third region is 3 μm or more.

5. The semiconductor device according to claim 1, wherein a width, in a predetermined direction, of a region in which the lower impurity layer is exposed in the third region is 2 μm or more.

6. The semiconductor device according to claim 1, wherein the electrode contacts the upper impurity layer of the first region and is isolated from the upper impurity layer of the third region.

7. The semiconductor device according to claim 3, wherein
   the semiconductor layered structure includes the first impurity between the outermost surface of the semiconductor layered structure and the active layer, and
   a relationship of $C12 \geq C13 \geq C11$ is satisfied where $C11$ is a contained amount of the first impurity in the first region, $C12$ is a contained amount of the first impurity in the second region, and $C13$ is a contained amount of the first impurity in the third region.

8. The semiconductor device according to claim 3, wherein
   the semiconductor layered structure includes a second impurity between an outermost surface of the semiconductor layered structure and the active layer, the second impurity suppressing the disordering, and
   a relationship of $C21 \geq C23 \geq C22$ is satisfied where $C21$ is a contained amount of the second impurity in the first region, $C22$ is a contained amount of the second impurity in the second region, and $C23$ is a contained amount of the second impurity in the third region.

9. The semiconductor device according to claim 1, wherein a length of the active layer of the third region in at least a predetermined direction among directions to the first region in parallel with the active layer is 5 μm or more.

10. The semiconductor device according to claim 1, wherein the third region includes an inert atom more than the second region.

11. The semiconductor device according to claim 1, wherein
    the semiconductor device is an edge-emission-type semiconductor laser device, and
    a predetermined direction is a direction in which light is guided in the semiconductor laser device.

12. The semiconductor device according to claim 11, wherein a length of the active layer of the third region in the predetermined direction is 5 μm or more in an entire region in which the light is guided.

13. The semiconductor device according to claim 1, wherein a length of the active layer of the third region is 5 μm or more in any direction from the third region toward the first region in parallel with the active layer.

14. The semiconductor device according to claim 1, wherein the disordering of the third region changes from a value identical to the disordering of the second region near a boundary of the third region and the second region to a value identical to the disordering of the first region near a boundary of the third region and the first region.

15. The semiconductor device according to claim 14, wherein the disordering of the third region changes in an approximate tapered shape in any direction from a boundary of the third region and the second region to a boundary of the third region and the first region in parallel with the active layer.

16. The semiconductor device according to claim 14, wherein the disordering of the third region changes in an approximate stepped shape in any direction from a boundary of the third region and the second region to a boundary of the third region and the first region in parallel with the active layer.

17. The semiconductor device according to claim 14, wherein the disordering of the third region decreases rapidly near the first region in any direction from a boundary of the third region and the second region to a boundary of the third region and the first region in parallel with the active layer.

18. The semiconductor device according to claim 14, wherein the disordering of the third region repeatedly increases and decreases in any direction from a boundary of the third region and the second region to a boundary of the third region and the first region in parallel with the active layer.

* * * * *